(12) United States Patent
Saboco

(10) Patent No.: US 8,324,025 B2
(45) Date of Patent: Dec. 4, 2012

(54) POWER SEMICONDUCTOR DEVICE PACKAGING

(75) Inventor: Romeo Alvarez Saboco, Carmona (PH)

(73) Assignee: Team Pacific Corporation, Taguig, M.M. (PH)

( * ) Notice: Subject to any disclaimer, the term of this patent is extended or adjusted under 35 U.S.C. 154(b) by 60 days.

(21) Appl. No.: 13/083,531

(22) Filed: Apr. 9, 2011

(65) Prior Publication Data

US 2011/0260305 A1    Oct. 27, 2011

Related U.S. Application Data

(60) Provisional application No. 61/326,674, filed on Apr. 22, 2010.

(51) Int. Cl.
*H01L 21/00* (2006.01)

(52) U.S. Cl. . 438/111; 438/123; 438/124; 257/E23.052; 257/670; 257/692

(58) Field of Classification Search ........... 257/E21.506, 257/E23.052, 666, 669–671, 676, 678, 692, 257/712, 727, 787; 438/106, 110–112, 121, 438/123, 124
See application file for complete search history.

(56) References Cited

U.S. PATENT DOCUMENTS

| | | | |
|---|---|---|---|
| 5,427,938 A * | 6/1995 | Matsumura et al. ..... 264/272.17 |
| 5,446,959 A | 9/1995 | Kim et al. | |
| 5,939,775 A | 8/1999 | Bucci et al. | |
| 6,107,676 A * | 8/2000 | Suzuki ......................... 257/666 |
| 6,436,736 B1 | 8/2002 | Embong et al. | |
| 6,479,327 B2 * | 11/2002 | Takahashi et al. ............ 438/124 |
| 6,573,123 B2 | 6/2003 | Li et al. | |
| 6,667,547 B2 * | 12/2003 | Woodworth et al. ......... 257/696 |
| 6,756,658 B1 | 6/2004 | Gillett et al. | |
| 6,828,170 B2 * | 12/2004 | Roberts et al. .................. 438/27 |
| 7,582,958 B2 | 9/2009 | Brailey | |
| 7,839,004 B2 * | 11/2010 | Sakai ............................ 257/787 |
| 7,902,657 B2 * | 3/2011 | Gomez ......................... 257/692 |
| 8,193,622 B2 * | 6/2012 | Madrid ......................... 257/678 |
| 8,222,651 B2 * | 7/2012 | Kanazawa et al. .............. 257/88 |
| 2001/0019856 A1 | 9/2001 | Takahashi et al. | |
| 2006/0255362 A1 | 11/2006 | Otremba | |
| 2007/0205493 A1 | 9/2007 | Tung et al. | |
| 2008/0290484 A1 | 11/2008 | Low et al. | |

* cited by examiner

*Primary Examiner* — Chris Chu

(74) *Attorney, Agent, or Firm* — Ash Tankha; Lipton, Weinberger & Husick

(57) ABSTRACT

A method for packaging one or more power semiconductor devices is provided. A lead frame comprising one or more base die paddles, multiple lead terminals, and a tie bar assembly is constructed. The lead terminals extend to a predetermined elevation from the base die paddles. The base die paddles are connected to the lead terminals by the tie bar assembly. The tie bar assembly mechanically couples the base die paddles to each other and to the lead terminals. The tie bar assembly is selectively configured to isolate the lead terminals from the base die paddles and to enable creation of multiple selective connections between one or more of the lead terminals and one or more power semiconductor devices mounted on the base die paddles, thereby enabling flexible packaging of one or more isolated and/or non-isolated power semiconductor devices and increasing their power handling capacity.

25 Claims, 23 Drawing Sheets

POWER SEMICONDUCTOR DEVICE PACKAGING

CROSS REFERENCE TO RELATED APPLICATIONS

This application claims the benefit of provisional patent application No. 61/326,674 titled "Power Semiconductor Device Packaging", filed on Apr. 22, 2010 in the United States Patent and Trademark Office.

The specification of the above referenced patent application is incorporated herein by reference in its entirety.

BACKGROUND

A semiconductor device package typically comprises a lead frame, a semiconductor die, and an encapsulating package body. The lead frame comprises a base die paddle, lead terminals and tie bars, where the tie bars may or may not mechanically support the base die paddle and the lead terminals.

High power semiconductor devices of about 30 volts to about 1000 volts or higher operate at very high temperatures. Typically, encapsulated high power semiconductor devices, for example, power metal oxide semiconductor field effect transistors (MOSFETs), insulated gate bipolar transistors (IGBTs), silicon controlled rectifiers (SCRs), etc., are provided in non-isolated packages. Conventional packaging of encapsulated non-isolated high power semiconductor devices, for example, a MOSFET comprising three lead terminals, namely, a gate lead terminal, a source lead terminal, and a drain lead terminal, comprise connecting one of the lead terminals, for example, the drain lead terminal of the MOSFET to a base metal of the package on which the high power semiconductor device is mounted. When connected in this manner, very high voltages develop at the base metal which presents a hazardous situation to both the high power semiconductor device as well as working personnel operating in such an environment. Furthermore, this method of packaging limits the choices available for configuring the interconnections of the lead terminals. Therefore, there is a need for a method of packaging a power semiconductor device that allows flexible configuration of the lead terminal interconnections.

Most discrete power semiconductor devices are plastic encapsulated using a strip form lead frame constructed such that at least one of the terminals is connected to the base die paddle where the power semiconductor device is mounted. Since the base die paddle is electrically connected to the power semiconductor device, typically to the drain side of the power semiconductor device, the power semiconductor device is mounted on an external heat sink using an insulation pad to avoid an electrical hazard to the power semiconductor devices and packages as well as personnel working on the power semiconductor devices and packages. Conventionally, insulating pads are used to provide isolation between the external heat sink and the power semiconductor device and also to provide thermal coupling from the power semiconductor device to the external heat sink to prevent over-heating and early device failure. However, in practice, there is a certain trade-off while deciding between good thermal coupling and electrical isolation, since adding electrical isolation results in an increase in thermal resistance which deprecates thermal coupling.

Typical applications of packaged power semiconductors require electrical isolation of the external base die paddle, where the drain side of the power semiconductor device is electrically mounted to an external heat sink and to the rest of the circuits. Due to the high voltage present on packaged power semiconductor devices, electrical isolation is required to provide safety to personnel working on the electronic circuit as well as to prevent damage to other electrical components. Power semiconductor devices also generate excessive heat which needs to be dissipated.

Conventionally, thermal tape or other insulating pads are used between the packaged power semiconductor devices and the external heat sink to provide the necessary electrical isolation as well as thermal coupling for heat dissipation. This standard device mounting technique is typically a compromise between the two requirements; that is electrical isolation and thermal coupling. Hence, there is a need for effective thermal coupling as well as electrical isolation between the base die paddles of the packaged power semiconductor device to that of the external heat sink that dissipates the heat generated by the power semiconductor device.

Typical isolated high power semiconductor device packages utilize a direct copper bonded substrate for providing electrical isolation and thermal coupling. One surface of the direct copper bonded substrate is utilized as the base die paddle and multiple lead terminals are coupled to the surface of the direct copper bonded substrate. The opposing surface of the direct copper bonded substrate acts as an external metal for thermal coupling during mounting applications. Such packages are rendered expensive and less effective as these packages require multiple soldering joints on the lead terminals to construct a basic lead frame. Moreover, soldering multiple lead terminals to the lead frame necessitates critical alignment fixtures and elaborate jig that increase the cost of manufacture of such a lead frame. Furthermore, this arrangement further reduces lead terminal design options once the lead terminal assignment changes with respect to the power semiconductor devices.

High power modules, for example, power rectifiers typically exceed the performance limits of readily available packages, for example, TO247, TO264, and TO268 packages. The "TO" designation refers to transistor outline. Such packages for power modules are constructed by assembly of separate base die paddle and lead terminals. In such a construction, the semiconductor die is typically soldered to a non-standard base die paddle and separate lead terminals are mounted using a solder paste. An encapsulating package body of, for example, a plastic material envelops the semiconductor die while exposing the lead terminals and the base metal. A coating, for example, of dielectric or resin material, is applied as a final encapsulation for the power semiconductor device. This power module assembly is expensive due to manual operations required as well as the high cost of non-standard materials and processes. Packaging using this method is also unreliable due to weak encapsulation of the semiconductor die and higher penetration of moisture to the packaged power semiconductor device. There is a need for a method of packaging semiconductor devices that allows integration of power modules into existing packaging standards and permits configuring the power semiconductor devices according to required applications with increased design options.

Hence, there is a long felt but unresolved need for a method for packaging one or more power semiconductor devices that increases power handling and current sinking capabilities of the power semiconductor devices, allows integration into existing packaging standards, reduces labor costs and can be easily constructed from current tooling methodologies, permits configuring according to required applications with increased design options, and ensures safety of personnel involved in operations of such high power semiconductor devices.

SUMMARY OF THE INVENTION

This summary is provided to introduce a selection of concepts in a simplified form that are further described in the detailed description of the invention. This summary is not intended to identify key or essential inventive concepts of the claimed subject matter, nor is it intended for determining the scope of the claimed subject matter.

The method disclosed herein addresses the above stated need for packaging one or more power semiconductor devices that increases power handling and current sinking capabilities of the power semiconductor devices, allows integration into existing packaging standards, reduces labor costs and can be easily constructed from current tooling methodologies, permits configuring according to required applications with increased design options, and ensures safety of personnel involved in operations of such high power semiconductor devices.

In the method for packaging one or more power semiconductor devices disclosed herein, a lead frame comprising one or more base die paddles, multiple lead terminals, and a tie bar assembly is constructed. The tie bar assembly connects the base die paddles of the lead frame to the lead terminals. The tie bar assembly mechanically couples the base die paddles to each other and to the lead terminals. The lead terminals extend to a predetermined elevation from the base die paddles. The tie bar assembly comprises, for example, base paddle tie bars, side tie bars, and terminal tie bars. The base paddle tie bars connect the base die paddles of the lead frame to each other. The side tie bars extend at the opposing ends of the lead frame and between adjacent base die paddles of the lead frame, and connect the base die paddles to the lead terminals. The terminal tie bars connect the lead terminals of the lead frame to each other.

The tie bar assembly is selectively configured to isolate the lead terminals from the base die paddles. Multiple selective connections are created between one or more of the lead terminals and one or more power semiconductor devices mounted on the base die paddles. The selective configuration of the tie bar assembly and the selective connections created between one or more of the lead terminals and the power semiconductor devices enable flexible packaging of one or more isolated power semiconductor devices and/or one or more non-isolated power semiconductor devices and increases power handling capacity of the packaged power semiconductor devices.

In an embodiment, the packaging of the isolated power semiconductor devices comprises mounting a metallized substrate on one or more of the base die paddles of the lead frame, and mounting the power semiconductor devices on the mounted metallized substrate. One or more of the isolated lead terminals are selectively connected to the mounted power semiconductor devices, for example, by wire bonding for enabling flexible connections of the isolated lead terminals to the power semiconductor devices. The packaging of the non-isolated power semiconductor devices comprises directly mounting one or more power semiconductor devices on the base die paddles of the lead frame. The mounted power semiconductor devices are encapsulated in an encapsulating package body.

In an embodiment, the tie bar assembly is selectively configured to utilize two of the lead terminals as a common source and one of the lead terminals as a gate for increasing the power handling capacity of the power semiconductor devices. In another embodiment, the tie bar assembly is selectively configured to flexibly utilize the lead terminals as a drain lead terminal, a gate lead terminal, and a source lead terminal.

In an embodiment, the tie bar assembly is selectively configured to utilize the isolated lead terminals as common lead terminals and/or individual lead terminals. For example, the terminal tie bars of the tie bar assembly of the lead frame are selectively configured to utilize the isolated lead terminals as a common lead terminal that can be connected to a cathode of each of adjacent semiconductor power diodes. The terminal tie bars of the tie bar assembly of the lead frame are also selectively configured to utilize the isolated lead terminals as individual lead terminals that can be connected to, for example, an anode of each of the adjacent semiconductor power diodes.

In an embodiment, two of the lead terminals of the lead frame are connected to a source, one of the lead terminals is connected to a gate, and one of the base die paddles is left as a drain for increasing the power handling capacity of the mounted power semiconductor devices, where the gate, the source, and the drain are three terminals of the mounted power semiconductor devices. In another embodiment, one or more of the isolated lead terminals of the lead frame are configured as unused contacts for increasing safety of usage of the mounted power semiconductor devices.

In an embodiment, the method disclosed herein further comprises creating a power module by selectively configuring the tie bar assembly of the lead frame as a common terminal between adjacent power semiconductor devices.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and instrumentalities disclosed herein.

DETAILED DESCRIPTION OF THE INVENTION

Figure 1:
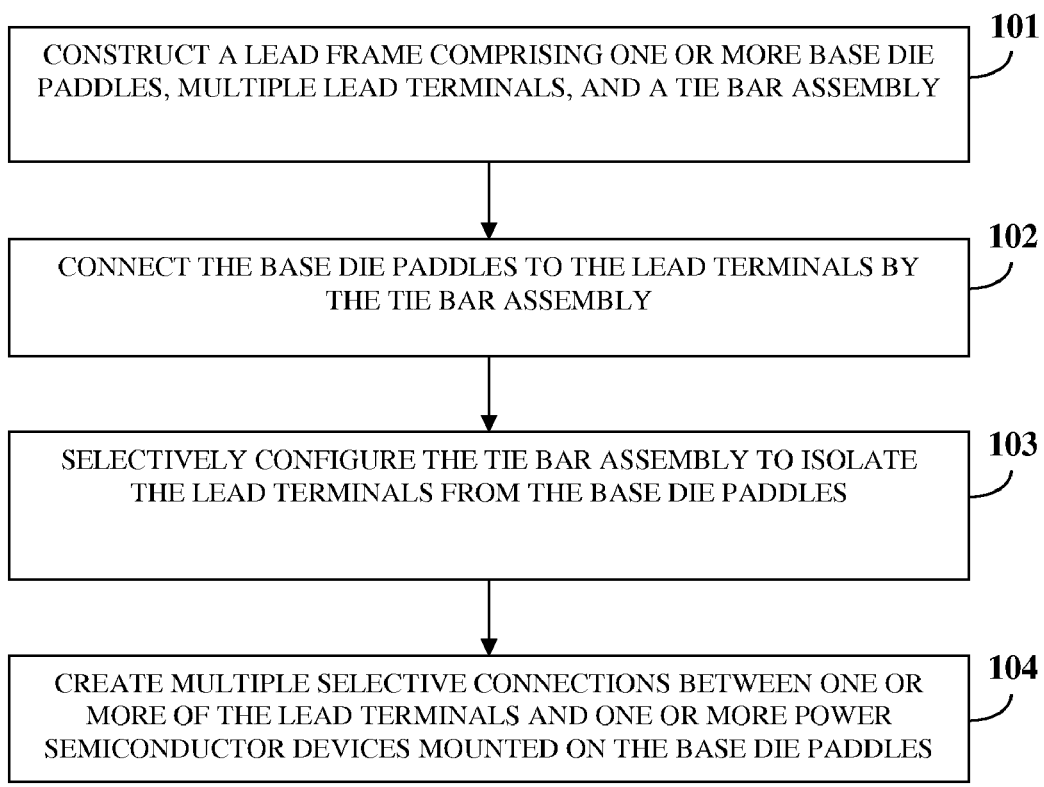
FIG. 1 illustrates a method for packaging one or more power semiconductor devices.

FIG. 1 illustrates a method for packaging one or more power semiconductor devices. Power semiconductor devices are semiconductor devices used, for example, as switches or rectifiers in power electronic circuits. The power semiconductor devices comprise, for example, thyristors, power diodes, power metal oxide semiconductor field effect transistors (MOSFETs), silicon-controlled rectifiers (SCRs), insulated gate bipolar transistors (IGBTs), etc. The method for packaging one or more power semiconductor devices comprises constructing 101a lead frame 200 comprising one or more base die paddles 207, multiple lead terminals 206, and a tie bar assembly 201 as exemplarily illustrated in FIG. 2A; connecting 102 the base die paddles 207 of the lead frame 200 to the lead terminals 206 by the tie bar assembly 201; selectively configuring 103 the tie bar assembly 201 to isolate the lead terminals 206 from the base die paddles 207; and creating 104 multiple selective connections between one or more of the lead terminals 206 and the power semiconductor devices mounted on the base die paddles 207.

As used herein, the term "configuring" refers to one or more of removing, cutting, trimming, retaining, or extending tie bars 202, 203, and 204 of the tie bar assembly 201 to enable creation of multiple selective connections between one or more of the lead terminals 206 and the base die paddles 207, and between one or more of the lead terminals 206 and the power semiconductor devices mounted on the base die paddles 207. One or more of the isolated lead terminals 206 are selectively connected to one or more of the mounted power semiconductor devices, for example, by wire bonding for enabling flexible connections of the isolated lead terminals 206 to the mounted power semiconductor devices.

Figure 2A:
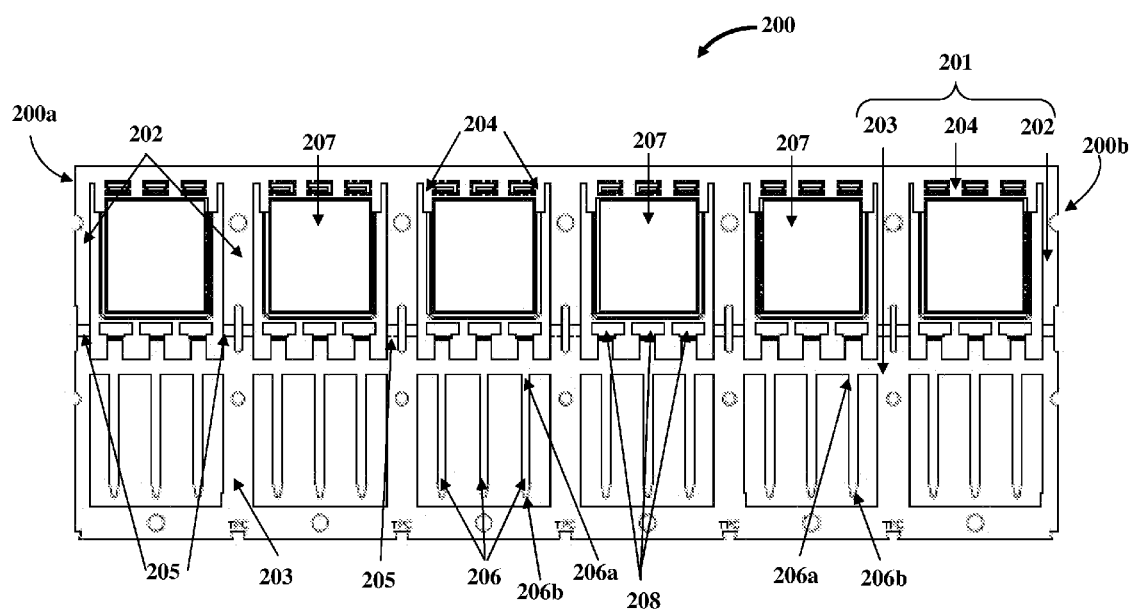
FIG. 2A exemplarily illustrates a lead frame constructed for packaging one or more power semiconductor devices.

FIG. 2A exemplarily illustrates a lead frame 200 constructed for packaging one or more power semiconductor devices. The lead frame 200 is made of a metal alloy, for example, nickel plated copper. The lead frame 200 is constructed, for example, by tool stamping or chemical etching. The lead frame 200 comprises one or more base die paddles 207, multiple lead terminals 206, and a tie bar assembly 201. The tie bar assembly 201 mechanically couples the base die paddles 207 to each other and to the lead terminals 206. In an embodiment, the lead frame 200 is made from nickel plated copper with both the base die paddles 207 and the lead terminals 206 having the same metal thickness, forming a single gage lead frame 200.

As exemplarily illustrated in FIG. 2A, the tie bar assembly 201 disclosed herein comprises, for example, side tie bars 202, terminal tie bars 203, and base paddle tie bars 204. The base paddle tie bars 204 connect the base die paddles 207 of the lead frame 200 to each other. The side tie bars 202 extend at opposing ends 200a and 200b of the lead frame 200 and in-between adjacent base die paddles 207 of the lead frame 200, and connect the base die paddles 207 to the lead terminals 206. In an embodiment, the side tie bars 202 also hold the lead terminals 206 together. The terminal tie bars 203 support and connect the lead terminals 206 of the lead frame 200 to each other and to the side tie bars 202. The base paddle tie bars 204 of the tie bar assembly 201 also connect the base die paddles 207 of the lead frame 200 to the lead terminals 206. The base paddle tie bars 204 extend and connect to the side tie bars 202 at the opposing ends 200a and 200b of the lead frame 200, which extend and connect to the terminal tie bars 203. The tie bar assembly 201 is selectively configured to isolate the lead terminals 206 from the base die paddles 207, such that none of the lead terminals 206 are electrically connected to the base die paddles 207. The isolation of the lead terminals 206 from the base die paddles 207 prevents the same electrical potential from existing between any of the lead terminals 206 to the base die paddles 207 on which the power semiconductor devices are mounted, thereby allowing flexible packaging options between isolated and non-isolated power semiconductor device packages.

In an embodiment, the lead frame 200 disclosed herein is used for creating a power module by selectively configuring the tie bar assembly 201 of the lead frame 200 as a common terminal between adjacent power semiconductor devices. For example, the lead frame 200 can be used for packaging power modules such as a full wave rectifier, a bridge rectifier, etc., by selectively cutting the base paddle tie bars 204 and the side tie bars 202 that connect the base die paddles 207 and the lead terminals 206. Two or more individual packaged power semiconductor devices are provided with a common drain by leaving the base paddle tie bars 204 in between the base die paddles 207 uncut. The lead terminals 206 being completely isolated from the base die paddles 207 allows more flexibility in choosing interconnections to the power semiconductor devices by selectively cutting the terminal tie bars 203.

Figure 2B:
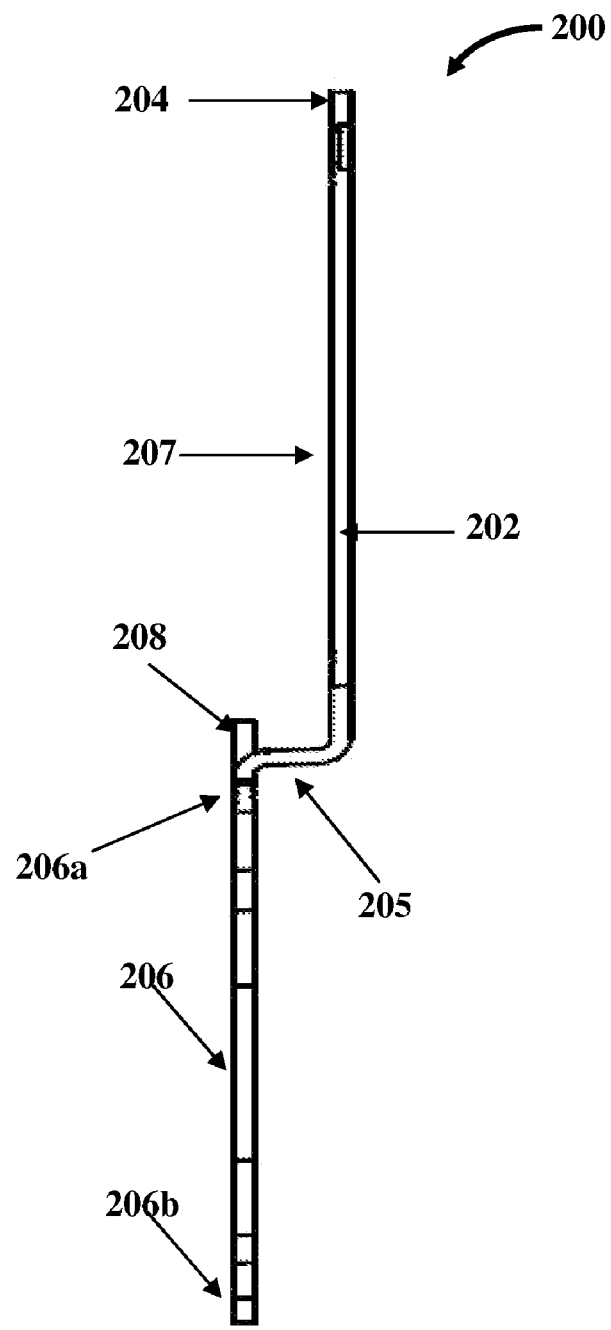
FIG. 2B exemplarily illustrates a side orthogonal view of the lead frame constructed for packaging one or more power semiconductor devices, showing extension of lead terminals of the lead frame to a predetermined elevation from base die paddles of the lead frame.

FIG. 2B exemplarily illustrates a side orthogonal view of the lead frame 200 constructed for packaging one or more power semiconductor devices, showing extension of the lead terminals 206 to a predetermined elevation 205 from the base die paddles 207. The tie bar assembly 201, as exemplarily illustrated in FIG. 2A, connects the base die paddles 207 of the lead frame 200 to the lead terminals 206, where the lead terminals 206 extend to a predetermined elevation 205 from the base die paddles 207. The lead terminals 206 are elevated above the base die paddles 207 by having a down-set forming on the side tie bars 202. The term "down-set" refers to a stepped portion of the lead frame 200 that provides an offset for the base die paddles 207 relative to the lead terminals 206.

Each of the lead terminals 206 comprises a proximal end 206a and a distal end 206b. The distal ends 206b of the lead terminals 206 are used for external electrical connection. The proximal ends 206a of the lead terminals 206 are connected to terminal bonding pads 208. The terminal bonding pads 208 are used for wire bonding the lead terminals 206 to the base die paddles 207 or the power semiconductor devices. The tie bar assembly 201 is selectively configured to isolate the lead terminals 206 from the base die paddles 207 and to enable creation of multiple selective connections between one or more of the lead terminals 206 and one or more power semiconductor devices mounted on the base die paddles 207. In an embodiment, one or more of the isolated lead terminals 206 are configured as unused contacts without wire bonding for increasing safety of usage of the mounted power semiconductor devices. The selective configuration of the tie bar assembly 201 and the selective connections created between one or more of the lead terminals 206 and one or more power semiconductor devices enable flexible packaging of one or more isolated power semiconductor devices and/or non-isolated power semiconductor devices, and increases power handling capacity of the packaged power semiconductor devices.

Figure 3:
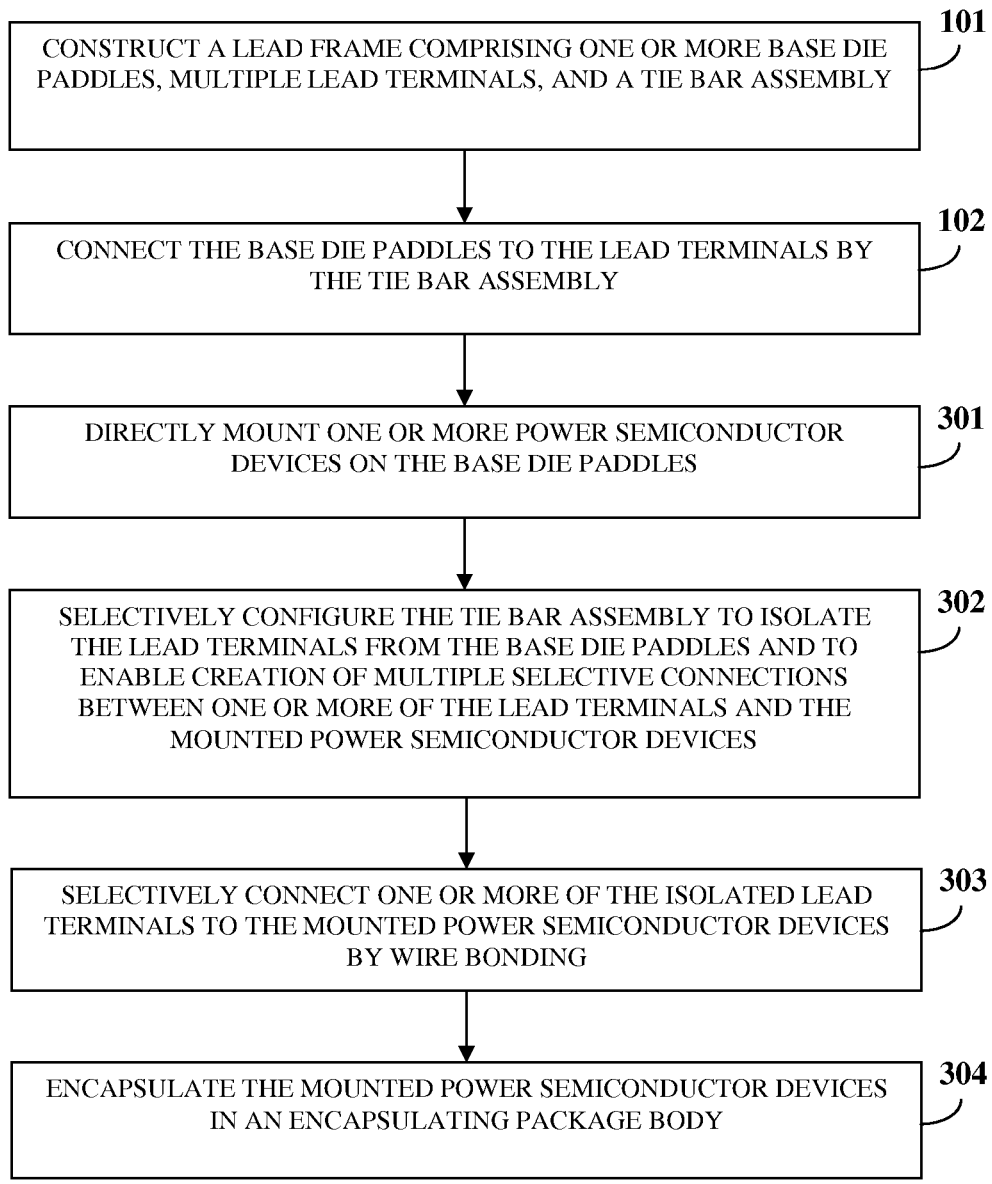
FIG. 3 illustrates a method for packaging one or more non-isolated power semiconductor devices.

FIG. 3 illustrates a method for packaging one or more non-isolated power semiconductor devices. As exemplarily illustrated in FIG. 2A, a lead frame 200 comprising one or more base die paddles 207, multiple lead terminals 206, and a tie bar assembly 201, is constructed 101. The tie bar assembly 201 connects 102 the base die paddles 207 of the lead frame 200 to the lead terminals 206, where the tie bar assembly 201 mechanically couples the base die paddles 207 to each other and to the lead terminals 206. One or more power semiconductor devices 500 are directly mounted 301 on the base die paddles 207 as exemplarily illustrated in FIGS. 6-8. The tie bar assembly 201 is selectively configured 302 to isolate the lead terminals 206 from the base die paddles 207 and to enable creation of multiple selective connections between one or more of the lead terminals 206 and the mounted power semiconductor devices 500. One or more of the isolated lead terminals 206 are selectively connected 303 to one or more of the mounted power semiconductor devices 500, for example, by wire bonding for enabling flexible connections of the isolated lead terminals 206 to the mounted power semiconductor devices 500. The mounted power semiconductor devices 500 are then encapsulated 304 in an encapsulating package body 701 to create a non-isolated power semiconductor device package 1000 as exemplarily illustrated in FIGS. 10A-10B.

Figure 4:
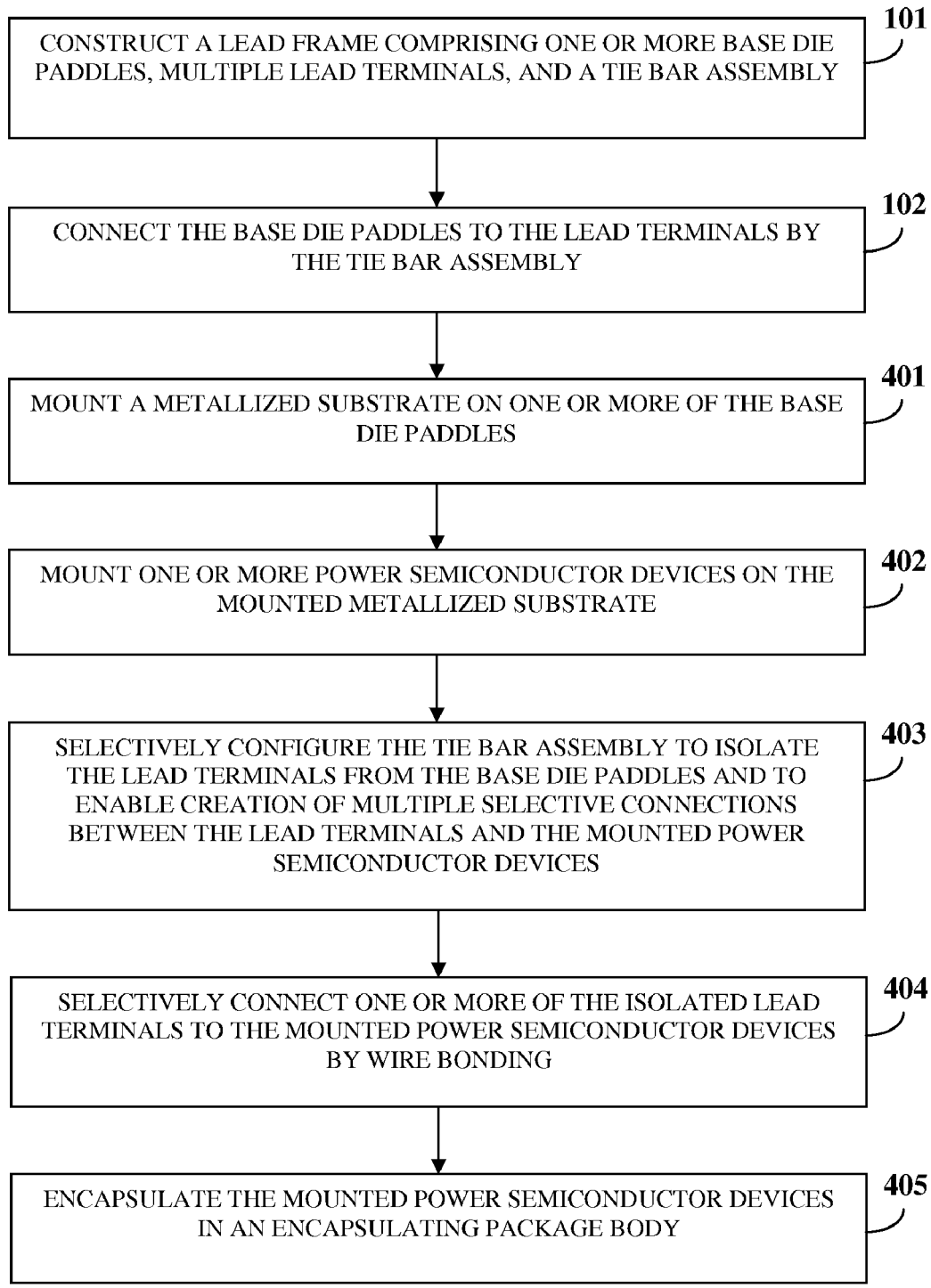
FIG. 4 illustrates a method for packaging one or more isolated power semiconductor devices.

FIG. 4 illustrates a method for packaging one or more isolated power semiconductor devices. A lead frame 200 comprising one or more base die paddles 207, multiple lead terminals 206, and a tie bar assembly 201, as exemplarily illustrated in FIG. 2A, is constructed 101. The tie bar assembly 201 connects 102 the base die paddles 207 of the lead frame 200 to the lead terminals 206, where the tie bar assembly 201 mechanically couples the base die paddles 207 to each other and to the lead terminals 206. A metallized substrate 901 is mounted 401 on one or more of the base die paddles 207 of the lead frame 200 prior to mounting of the power semiconductor devices 500 as exemplarily illustrated in FIGS. 9A-9B. One or more power semiconductor devices 500 are mounted 402 on the mounted metallized substrate 901. The tie bar assembly 201 is selectively configured 403 to isolate the lead terminals 206 from the base die paddles 207 and to enable creation of multiple selective connections between one or more of the lead terminals 206 and the mounted power semiconductor devices 500. One or more of the isolated lead terminals 206 are selectively connected 404 to the mounted power semiconductor devices 500, for example, by wire bonding for enabling flexible connections of the isolated lead terminals 206 to the mounted power semiconductor devices 500. The mounted power semiconductor devices 500 are then encapsulated 405 in an encapsulating package body 701 to create an isolated power semiconductor device package 1100 as exemplarily illustrated in FIGS. 11A-11B.

Figure 5:
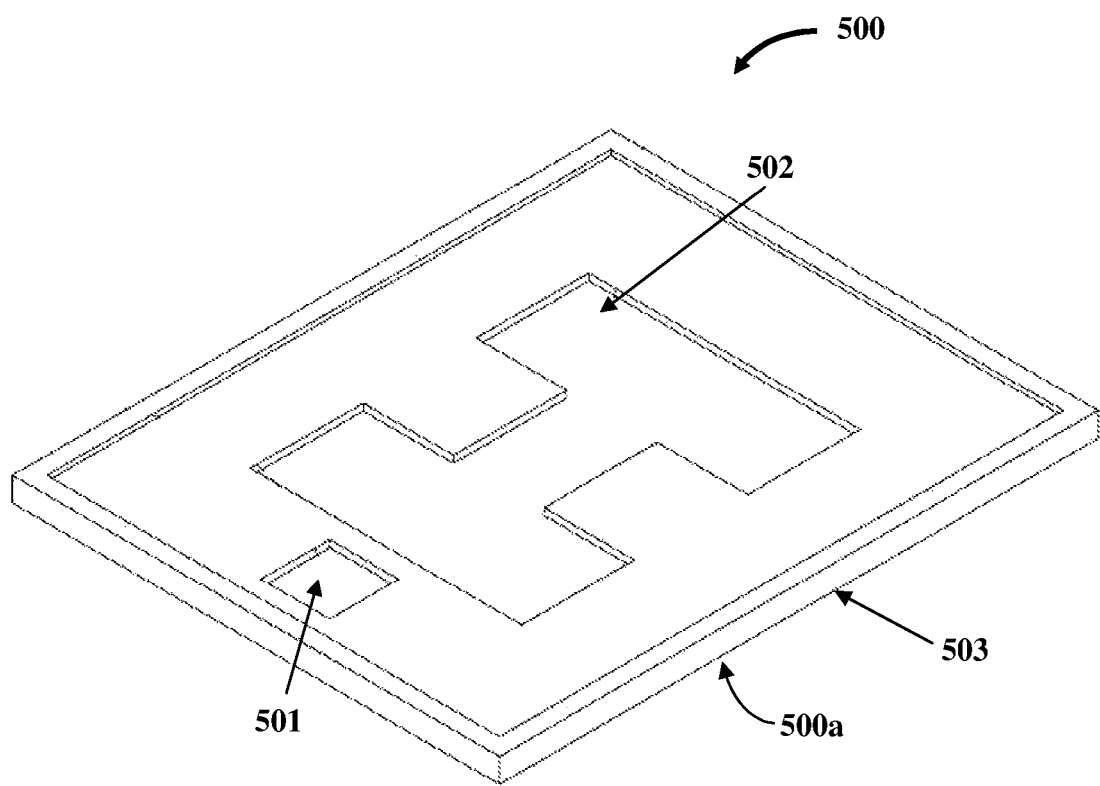
FIG. 5 exemplarily illustrates a top perspective view of a metal oxide semiconductor field effect transistor (MOSFET) device.

FIG. 5 exemplarily illustrates a top perspective view of a metal oxide semiconductor field effect transistor (MOSFET) device 500. The power semiconductor device, for example, a power semiconductor MOSFET device 500, an insulated gate bipolar transistor (IGBT), a silicon-controlled rectifier (SCR), etc., is packaged using the methods disclosed in the detailed description of FIGS. 3-4 to allow integration into an electronic circuit. As exemplarily illustrated in FIG. 5, the power semiconductor MOSFET device 500 comprises a gate bond pad 501, a source bond pad 502, and a drain bond pad 503. The rear surface 500a of the MOSFET device 500 forms the drain bond pad 503 of the MOSFET device 500. One or more of the lead terminals 206 of the lead frame 200 disclosed herein are selectively connectable to the gate bond pad 501, the source bond pad 502, and the drain bond pad 503 using wire bonds 601 as exemplarily illustrated in FIGS. 6-8 and FIG. 9A.

Figure 6:
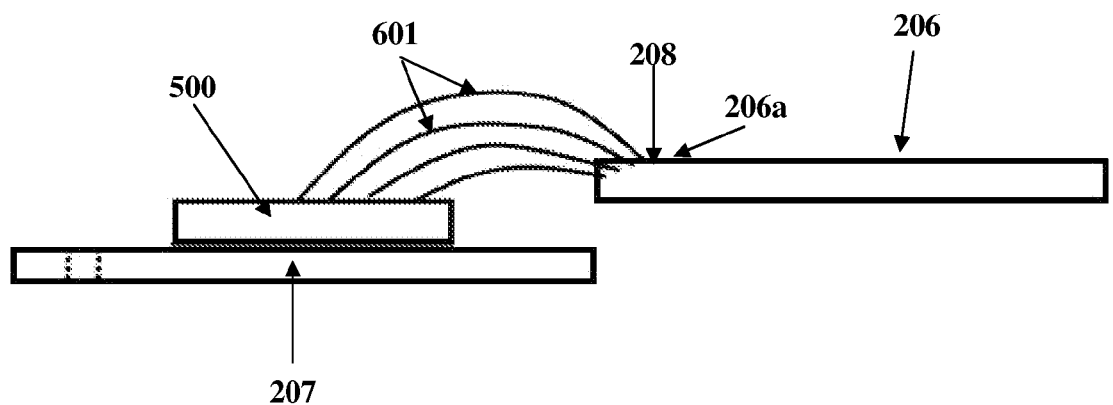
FIG. 6 exemplarily illustrates a side orthogonal view of a power semiconductor MOSFET device mounted on a base die paddle of the lead frame and connected to the lead terminals of the lead frame using wire bonds.

FIG. 6 exemplarily illustrates a side orthogonal view of a power semiconductor MOSFET device 500 mounted on a base die paddle 207 of the lead frame 200 and connected to the lead terminals 206 of the lead frame 200 using wire bonds 601. The power semiconductor MOSFET device 500 is directly mounted and soldered on a base die paddle 207 of the lead frame 200 using, for example, a solder paste, an epoxy, or a solder alloy, thereby creating a non-isolated power semiconductor device. The terminal bonding pads 208 on the proximal ends 206a of three lead terminals 206 are electrically connected to the gate bond pad 501, the source bond pad 502, and the drain bond pad 503 of the power semiconductor MOSFET device 500, for example, by wire bonding using wire bonds 601. "Wire bonding" refers to making interconnections between components using wire bonds 601 during semiconductor device fabrication. Wire bonding of the power semiconductor devices 500 enables flexible configuration to any of the lead terminals 206. In an embodiment, conductor straps (not shown) are used to electrically connect the power semiconductor device bond pads 501, 502, and 503 to the lead terminals 206. The distal ends 206b of the lead terminals 206 extend outwardly and are exposed for external electrical connection.

For purposes of illustration, the detailed description refers to packaging of a power MOSFET device 500; however, the scope of the method disclosed herein is not limited to packaging power MOSFET devices 500 but may be extended to include packaging of any power semiconductor device or a combination of semiconductor devices, for example, insulated gate bipolar transistors (IGBTs), silicon-controlled rectifiers (SCR), semiconductor power diodes, etc.

Figure 7:
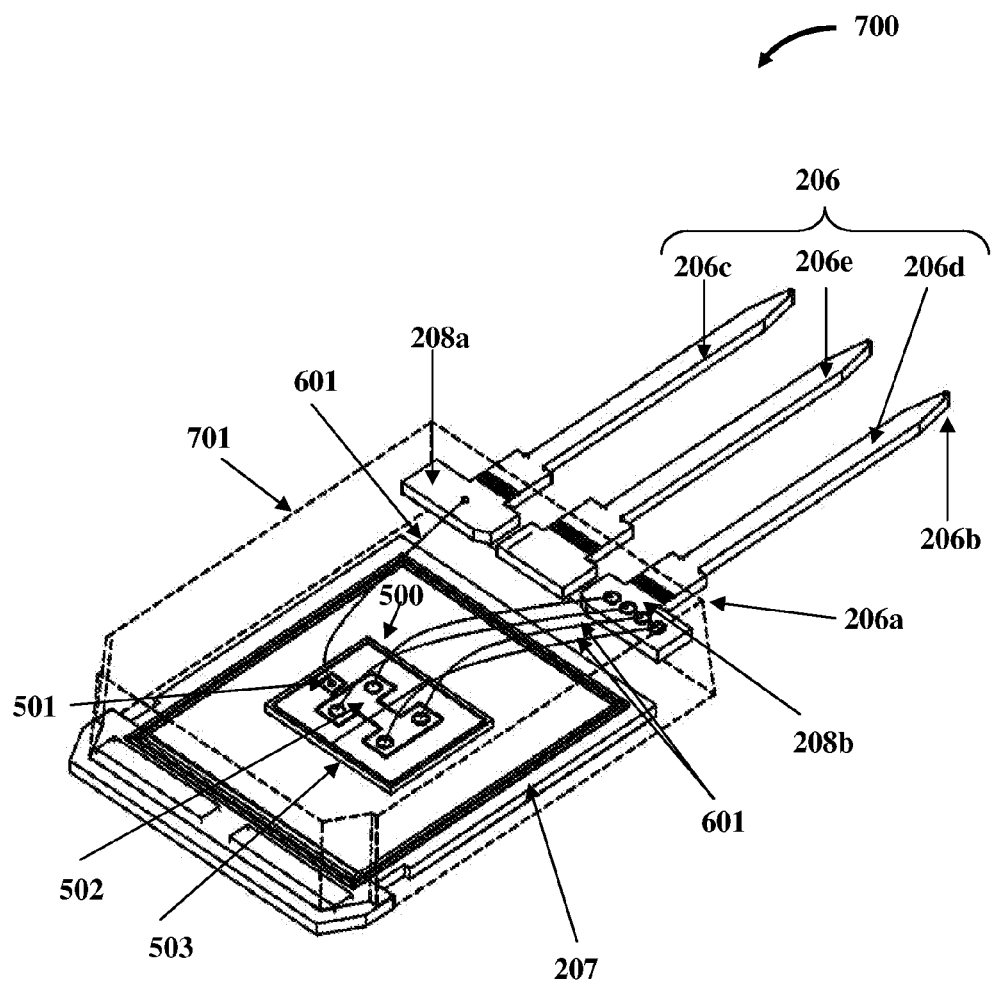
FIG. 7 exemplarily illustrates a top perspective view of a packaged power semiconductor MOSFET device with wire bonded lead terminals.

FIG. 7 exemplarily illustrates a top perspective view of a packaged power semiconductor MOSFET device 700 with wire bonded lead terminals 206. The base die paddle 207 of the selectively configured lead frame 200, the power semiconductor MOSFET device 500, and the wire bonds 601 are encapsulated in an encapsulating package body 701 of, for example, resin or plastic, exposing only the distal ends 206b of the lead terminals 206, for example, by plastic injection molding or potting techniques. The lead frame 200, the power semiconductor MOSFET device 500, and the wire bonds 601 are encapsulated with, for example, a resin or plastic encapsulating package body 701 by use of mould tools. The distal ends 206b of the lead terminals 206 are exposed for external connection of the power semiconductor MOSFET device 500 mounted on the base die paddle 207. The encapsulating package body 701 is, for example, made of an insulating material such as epoxy resin. The tie bar assembly 201 is selectively configured to flexibly utilize the lead terminals 206 as an unused terminal 206e, a gate lead terminal 206c, and a source lead terminal 206d. In FIG. 7, a gate terminal bonding pad 208a of the gate lead terminal 206c is electrically connected to the gate bond pad 501 of the power semiconductor MOSFET device 500 using wire bonds 601, while a source terminal bonding pad 208b of the source lead terminal 206d is electrically connected to the source bond pad 502 of the power semiconductor MOSFET device 500 using wire bonds 601. The middle lead terminal 206e is configured as an unused contact.

Figure 8:
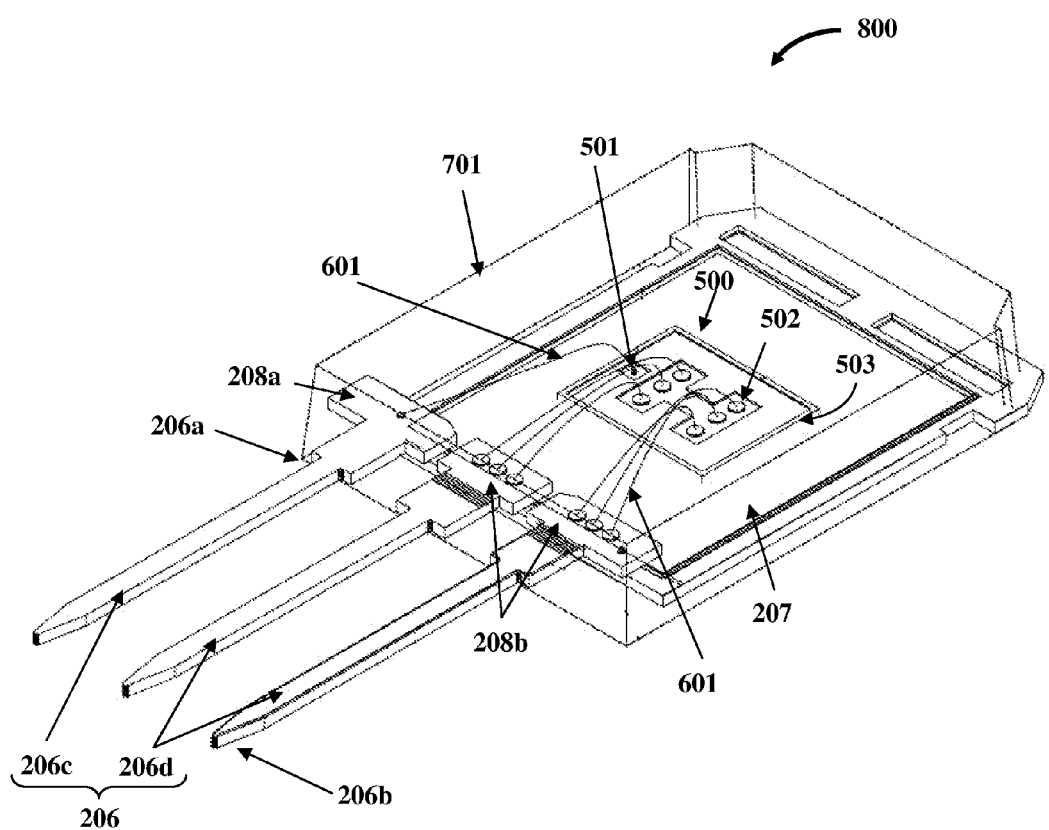
FIG. 8 exemplarily illustrates a top perspective view of a power semiconductor device package with selective connections between the lead terminals of the lead frame and a power semiconductor device mounted on a base die paddle of the lead frame.

FIG. 8 exemplarily illustrates a top perspective view of a power semiconductor device package 800 with selective connections between the lead terminals 206 of the lead frame 200, exemplarily illustrated in FIG. 2A, and a power semiconductor MOSFET device 500 mounted on a base die paddle 207 of the lead frame 200. The tie bar assembly 201, exemplarily illustrated in FIG. 2A, is selectively configured to utilize two of the lead terminals 206d as a source and one of the lead terminals 206c as a gate for increasing the power handling capacity of the mounted power semiconductor device 500. The gate, the source, and the drain are three terminals of the mounted power semiconductor device 500. For example, in the power semiconductor device package 800 illustrated in FIG. 8, two source terminal bonding pads 208b on the proximal ends 206a of two lead terminals 206d are electrically connected to the source bond pad 502 of the power semiconductor MOSFET device 500 using wire bonds 601, while the gate terminal bonding pad 208a of one lead terminal 206c is wire bonded to the gate bond pad 501 of the power semiconductor MOSFET device 500. In this example, the base die paddle 207 forms the drain terminal. The selectively configured lead frame 200, the power semiconductor MOSFET device 500 mounted on the base die paddle 207, and the wire bonds 601 are encapsulated in the encapsulating package body 701 exposing only the distal ends 206b of the lead terminals 206.

The configuration exemplarily illustrated in FIGS. 7-8 effectively increases the power handling capacity of the power semiconductor device package 800 compared to configurations allowed by standard lead frame constructions having similar numbers of lead terminals 206. In an example, the current carrying capacity of a standard TO247 or TO264 package is doubled to about 120 amperes using the method for packaging disclosed in the detailed description of FIG. 3. The "TO" designation refers to transistor outline. The lead frame 200 disclosed herein therefore enables packaging flexibility and allows a designer to choose lead terminal pin assignments without spending a significant amount of money on tooling costs. The lead frame 200 disclosed herein enables selective configuration for creation of multiple selective connections between one or more of the lead terminals 206 and the base die paddles 207 and between one or more of the lead terminals 206 and the power semiconductor devices 500 mounted on the base die paddles 207.

Figure 9A:
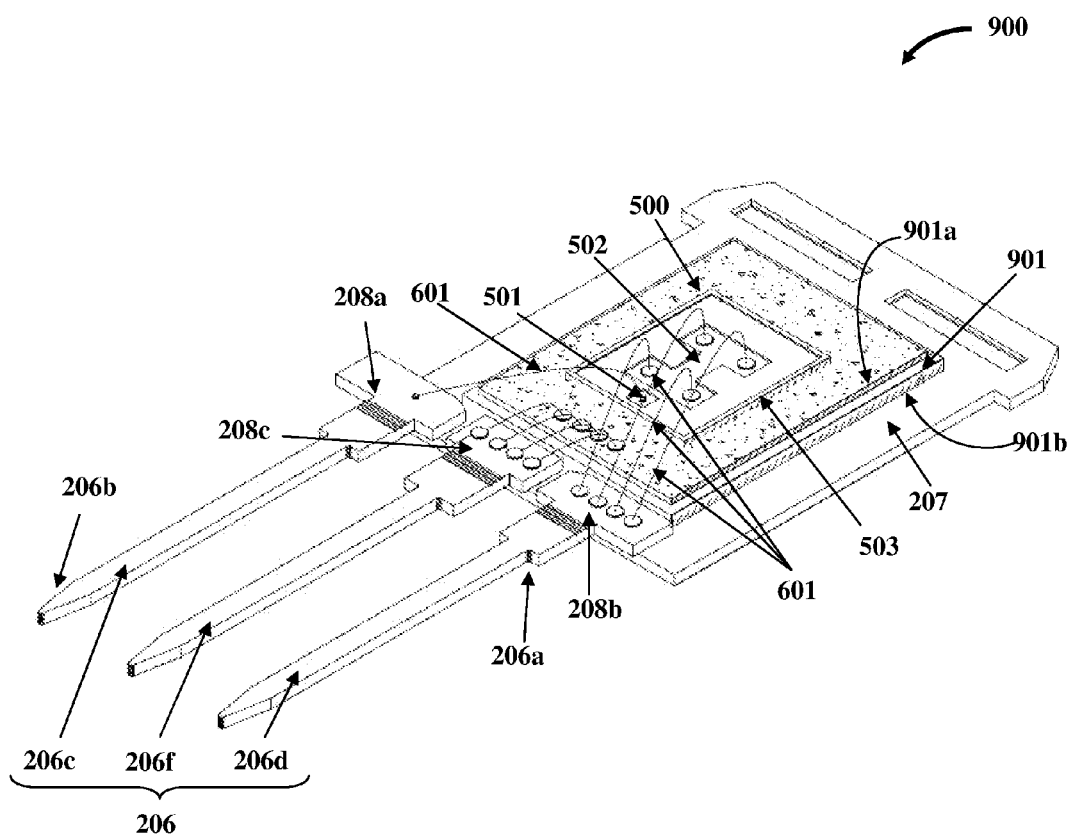
FIG. 9A exemplarily illustrates a top perspective view of an isolated power semiconductor device.
Figure 9B:
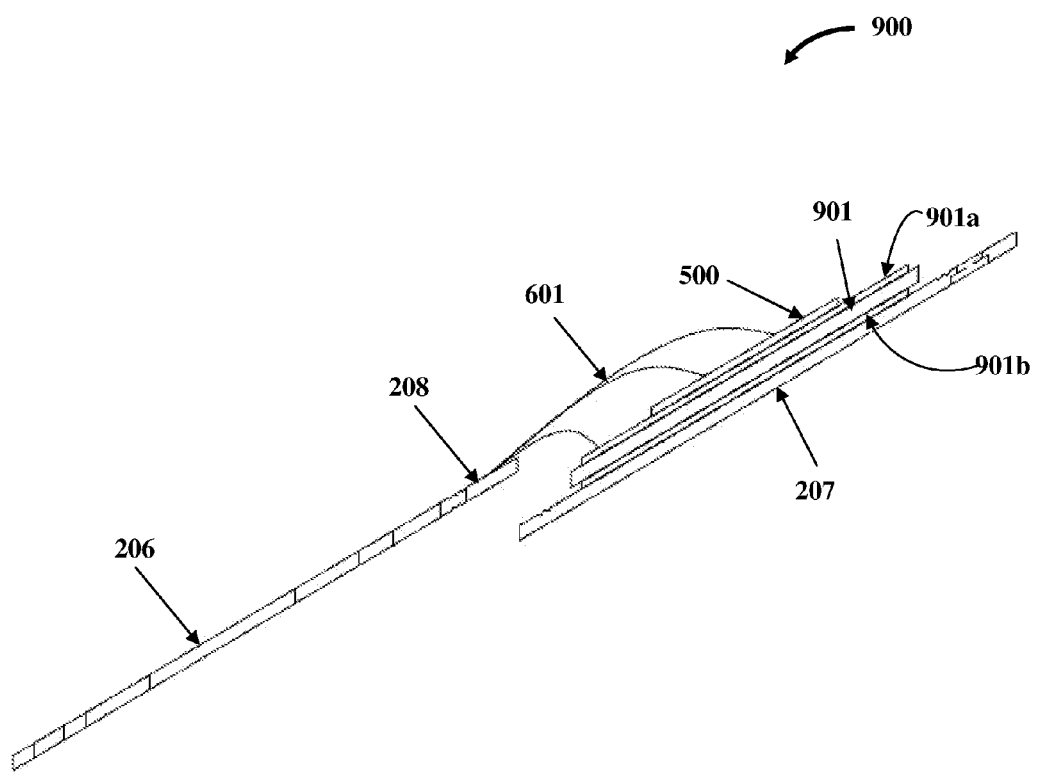
FIG. 9B exemplarily illustrates a side view of the isolated power semiconductor device.

FIG. 9A and FIG. 9B exemplarily illustrate a top perspective view and a side view of an isolated power semiconductor device 900 respectively. In this embodiment, a metallized substrate 901, with metallization on both sides 901a and 901b of the metallized substrate 901, is mounted or soldered on a base die paddle 207 using, for example, solder alloy preforms. The power semiconductor device, for example, the power semiconductor MOSFET device 500 is then mounted or soldered on the metallized substrate 901. In an embodiment, the drain bond pad 503 of the power semiconductor MOSFET device 500 is soldered onto the mounted metallized substrate 901. The metallized substrate 901 is made of a material having good thermal conductivity and high electrical isolating properties. The material of the metallized substrate 901 is, for example, alumina, aluminum nitride, beryllium oxide, etc. The metallized substrate 901 is mounted on the base die paddle 207 to electrically isolate the power semiconductor MOSFET device 500 from external electronic circuits. For example, a ceramic metallized substrate 901 is mounted on the base die paddle 207 to electrically isolate the power semiconductor MOSFET device 500 from the external electronic circuit. The area or side 901a on the metallized substrate 901 where the power semiconductor device 500 is mounted is electrically connected to a lead terminal 206f which then becomes the drain lead terminal. Wire bonds 601 using, for example, aluminum bonding, copper bonding, etc., connect the terminal bonding pads 208a, 208b, and 208c of the lead terminals 206b, 206d, and 206f respectively to the bond pads 501, 502, and 503 respectively of the power semiconductor MOSFET device 500.

The metallized substrate 901 mounted on the base die paddle 207 using solder alloy preforms, and a power semiconductor MOSFET device 500 mounted on the metallized substrate 901 is exemplarily illustrated in FIGS. 9A-9B. The power semiconductor MOSFET device 500 is mounted on the metallized substrate 901 using, for example, solder alloy preforms. The gate bond pad 501, the source bond pad 502 and the drain bond pad 503 of the power semiconductor MOSFET device 500 are connected to the terminal bonding pads 208a, 208b, and 208c respectively, for example, by wire bonding using wire bonds 601. The metallized substrate 901 forms the drain bond pad 503 of the power semiconductor MOSFET device 500 and is wire bonded to the drain lead terminal 206f through the terminal bonding pad 208c.

The method for packaging the power semiconductor devices, for example, 500, 1001, etc., disclosed herein results in lower costs of assembly due to flexibility in packaging application as well as the single lead frame 200 constructions that result in a simpler assembly process. The method for packaging the power semiconductor devices, for example, 500, 1001, etc., disclosed herein reduces the cost of mounting by eliminating use of elaborate electrical isolation and simplifies device construction. The construction of the lead terminals 206 isolated from the base die paddle 207 effectively lowers the cost of the isolated power semiconductor device 900 as well as application mounting cost.

In an embodiment, the lead frame 200 disclosed herein enables construction of power modules 1000 and 1100 as exemplarily illustrated in FIGS. 10A-10B and FIGS. 11A-11B respectively by packaging more than one power semiconductor device, for example, a semiconductor power diode 1001 in a single package and by selectively configuring the tie bar assembly 201 to increase power handling capacity and to reduce costs for the assembly lay-out required for such power modules 1000 and 1100. In another embodiment, the lead frame 200 enables multiple constructions of semiconductor power diodes 1001 and combination of different types of power modules, for example, 1000 and 1100 by having common base die paddles 207 and by utilizing the isolated lead terminals 206 to wire bond based on required electrical connections.

In an embodiment, the lead frame 200 enables flexible packaging of an electrically non-isolated semiconductor device 700 or 800 exemplarily illustrated in FIGS. 7-8 and an isolated semiconductor device 900 exemplarily illustrated in FIGS. 9A-9B in a single package while achieving reduced cost of assembly and lowered cost of integration into the electronic circuits. Moreover, since any of the lead terminals 206 can be electrically connected to the base die paddles 207 by internal wire bonds 601, the non-standard lead frame 200 can also be used in standard lead frame applications.

Figure 10A:
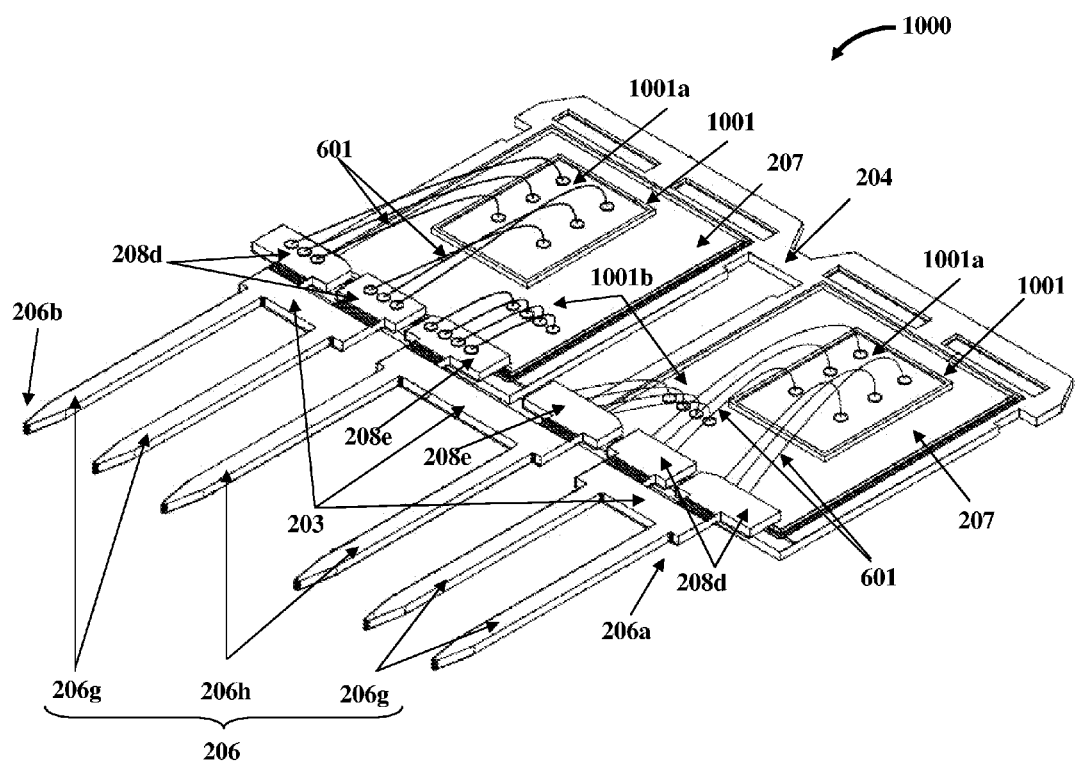
FIGS. 10A-10B exemplarily illustrate top perspective views of a non-isolated power module created for a full wave rectifier.
Figure 10B:
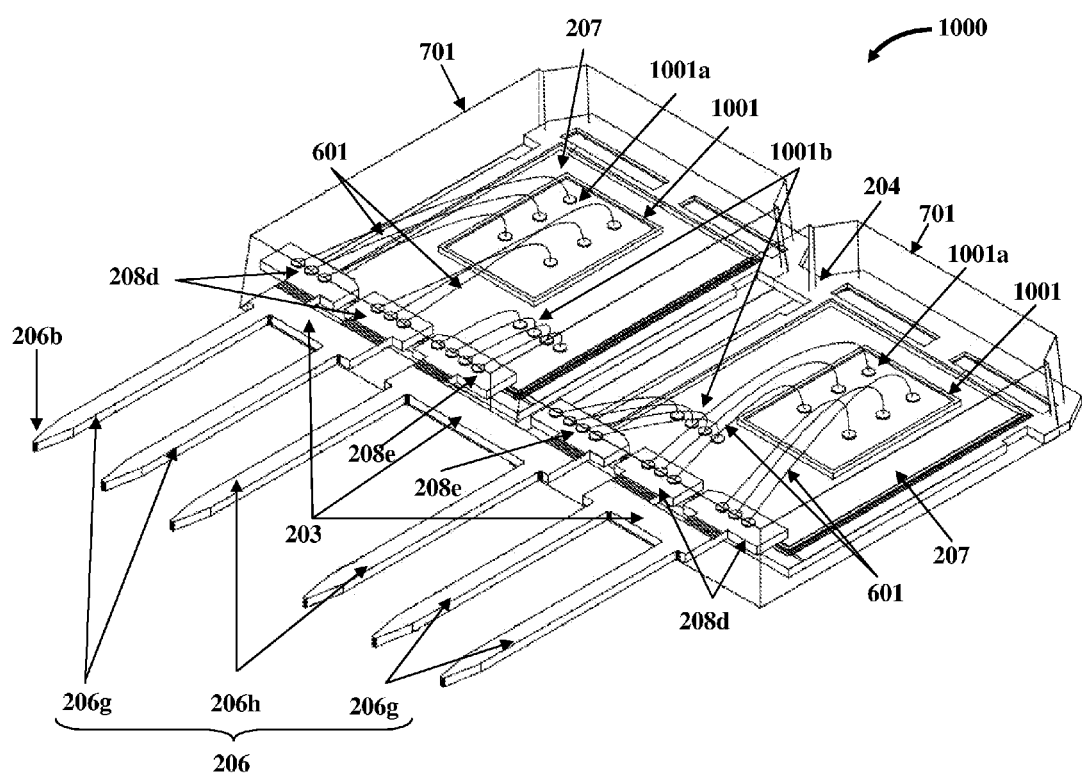

FIGS. 10A-10B exemplarily illustrate top perspective views of a non-isolated power module 1000 created for a full wave rectifier. As used herein, the term "power module" refers to a physical containment for several power semiconductor devices, for example, the semiconductor power diodes 1001, that provides an easy way to cool the power semiconductor devices 1001 and to connect the power semiconductor devices 1001 to external circuits. The method disclosed herein comprises creating a power module 1000 by selectively configuring the tie bar assembly 201 of the lead frame 200 as a common terminal between adjacent power semiconductor devices, for example, semiconductor power diodes 1001. Furthermore, the tie bar assembly 201 is selectively configured to utilize the isolated lead terminals 206 as common lead terminals 208e and individual lead terminals 208d. For example, the tie bar assembly 201 of the lead frame 200 exemplarily illustrated in FIG. 2A is selectively configured to utilize the isolated lead terminals 208e as a common lead terminal connected to a cathode 1001b of each of the semiconductor power diodes 1001 as exemplarily illustrated in FIGS. 10A-10B. The tie bar assembly 201 of the lead frame 200 is also selectively configured to utilize the isolated lead terminals 208d as individual lead terminals that can be connected to, for example, an anode 1001a of each of the semiconductor power diodes 1001 as exemplarily illustrated in FIGS. 10A-10B. The semiconductor power diodes 1001 are mounted directly on the base die paddles 207 of the lead frame 200 to create a non-isolated power module 1000.

As exemplarily illustrated in FIGS. 10A-10B, the terminal bonding pads 208d of the lead terminals 206g are electrically connected to the anode 1001a of each of the semiconductor power diodes 1001 using wire bonds 601, while the terminal bonding pads 208e of the lead terminals 206h are electrically connected to the cathode 1001b of each of the semiconductor power diodes 1001 through the base die paddle 207 using wire bonds 601. In this embodiment, the two semiconductor power diodes 1001 of the full wave rectifier have a common cathode 1001b.

A top perspective view of the non-isolated power module 1000 created for a full wave rectifier, encapsulated in an encapsulating package body 701 is exemplarily illustrated FIG. 10B. The non-isolated power module 1000 for a full wave rectifier, as exemplarily illustrated in FIGS. 10A-10B is constructed by selective configuration of the base paddle tie bars 204 and the terminal tie bars 203 of the tie bar assembly 201 and selective connections of the lead terminals 206 to the base die paddles 207 and the semiconductor power diodes 1001 using wire bonds 601. The two power semiconductor power diodes 1001 are provided with a common drain by leaving the base paddle tie bars 204 in between the base die paddles 207 uncut. The created non-isolated power module 1000 is then encapsulated in the encapsulating package body 701.

Figure 11A:
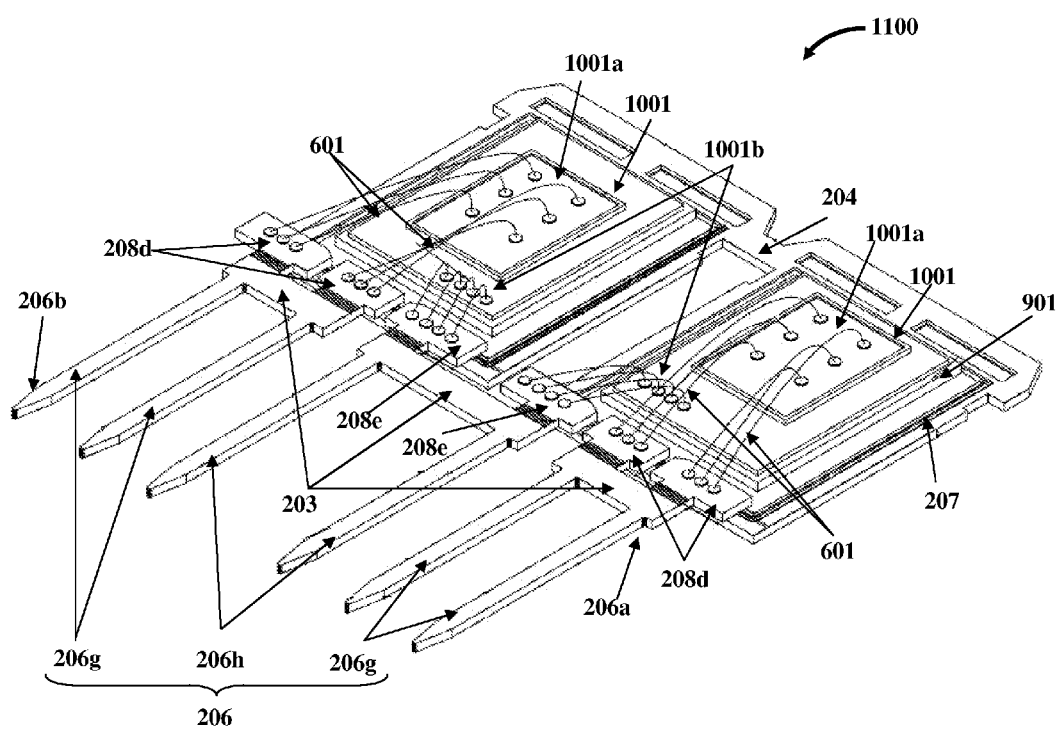
FIGS. 11A-11B exemplarily illustrate top perspective views of an isolated power module created for a full wave rectifier.
Figure 11B:
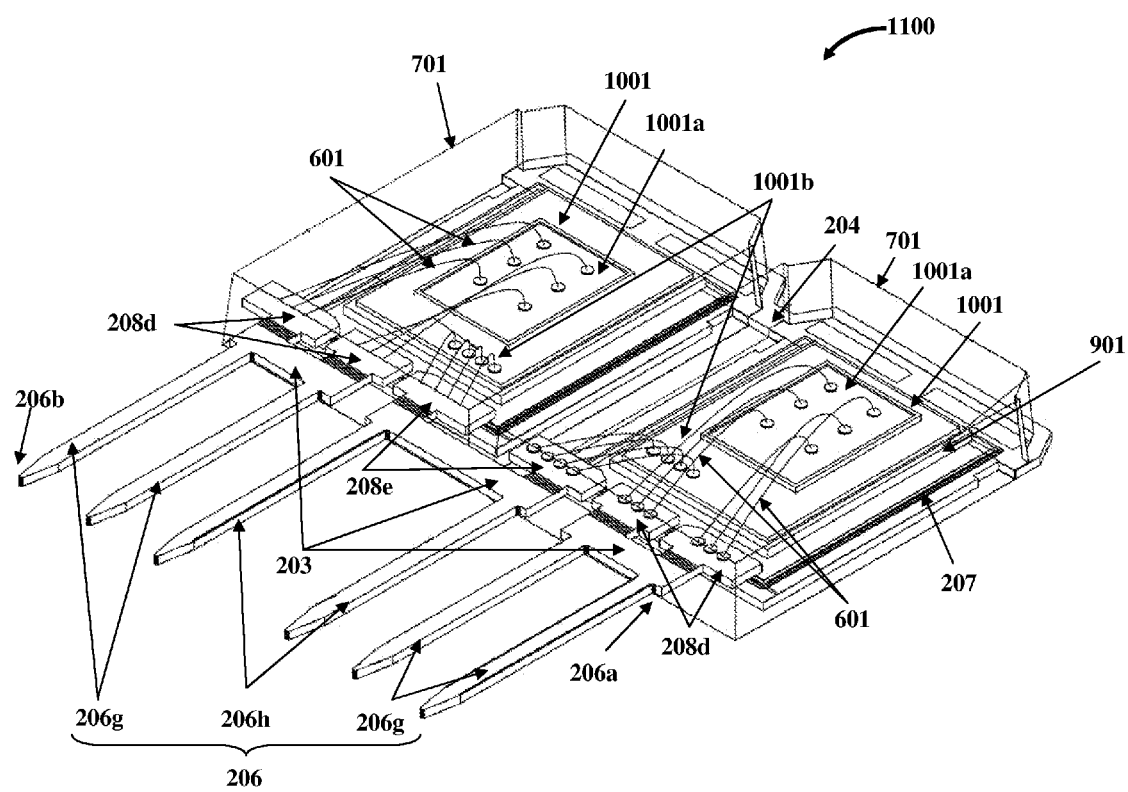

FIGS. 11A-11B exemplarily illustrate top perspective views of an isolated power module 1100 created for a full wave rectifier. FIG. 11A exemplarily illustrates a top perspective view of the isolated power module 1100 created for the full wave rectifier prior to encapsulation in the encapsulating package body 701. FIG. 11B exemplarily illustrates a top perspective view of the isolated power module 1100 created for the full wave rectifier, encapsulated in the encapsulating package body 701. The isolated power module 1100 is constructed by mounting a metallized substrate 901 on the base die paddles 207, for example, using solder alloy preforms and thereafter mounting the semiconductor power diodes 1001 on the metallized substrate 901. The metallized substrate 901 is made of, for example, alumina, aluminum nitride, etc. The metallized substrate 901 is mounted between the base die paddles 207 and the semiconductor power diodes 1001 to enable electrical isolation of the semiconductor power diodes 1001 from the external electronic circuit.

The isolated power module 1100 for a full wave rectifier, as exemplarily illustrated in FIG. 11B, is constructed by selective configuration of the base paddle tie bars 204 and the terminal tie bars 203 of the tie bar assembly 201, and selective connections of the lead terminals 206 to the base die paddles 207 and the semiconductor power diodes 1001 using wire bonds 601. The two power semiconductor power diodes 1001 are provided with a common drain by leaving the base paddle tie bars 204 in between the base die paddles 207 uncut. The created power module 1100 is then encapsulated in the encapsulating package body 701. As exemplarily illustrated in FIGS. 11A-11B, the terminal bonding pads 208d of the lead terminals 206g are electrically connected to the anode 1001a of the semiconductor power diodes 1001 using wire bonds 601, while the terminal bonding pads 208e of the lead terminals 206h are electrically connected to the cathode 1001b of the semiconductor power diodes 1001 through the metallized substrate 901 mounted on the base die paddle 207 using wire bonds 601. In this embodiment, the two semiconductor power diodes 1001 of the full wave rectifier have a common cathode 1001b.

FIGS. 12A-12D exemplarily illustrate a non-standard power semiconductor device package 1201 and standard power semiconductor device packages 1202, 1203, and 1204. The method for packaging disclosed herein can be applied to package standard and non-standard power semiconductor devices 500 and 1001.

Figure 12A:
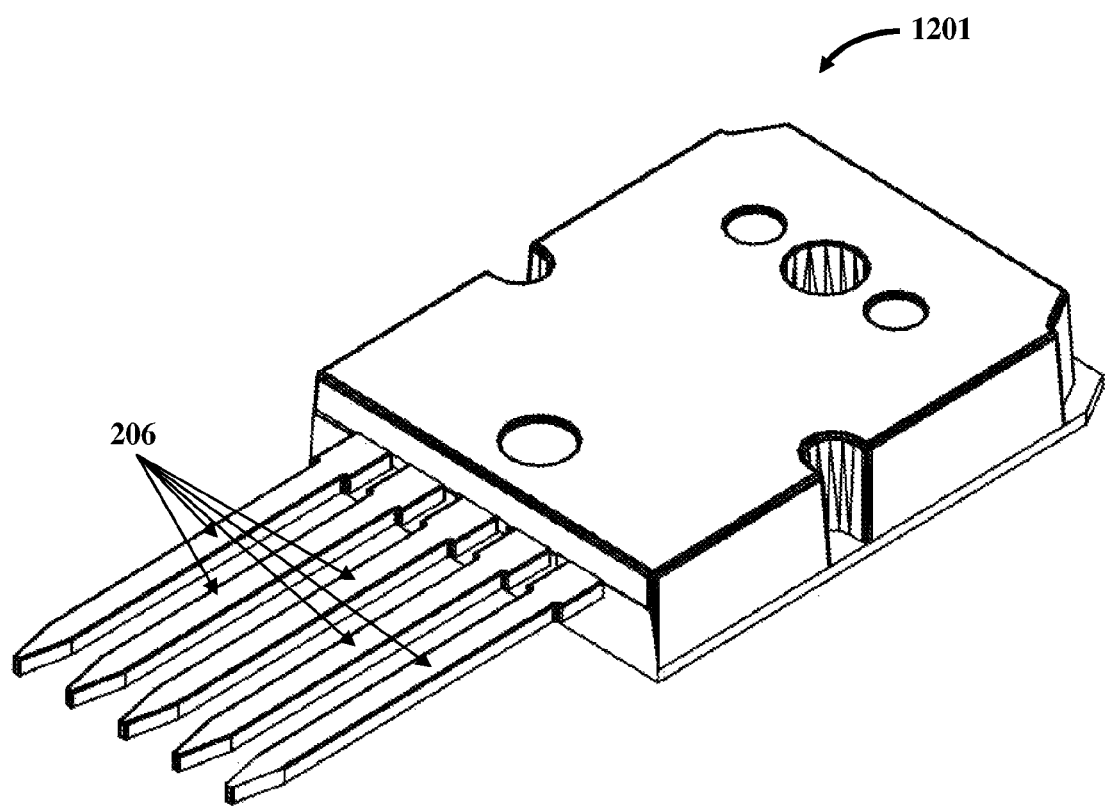
FIGS. 12A-12D exemplarily illustrate packaging of non-standard and standard power semiconductor devices.

FIG. 12A exemplarily illustrate a top perspective view of a non-standard power semiconductor device package 1201. The lead frame 200 is etched to have a number of lead terminals 206 as per the design of the electronic circuit in which the power semiconductor device is required to operate. The method for packaging disclosed herein can be applied to a non-standard power semiconductor device package 1201 with any number of lead terminals 206.

Figure 12B:
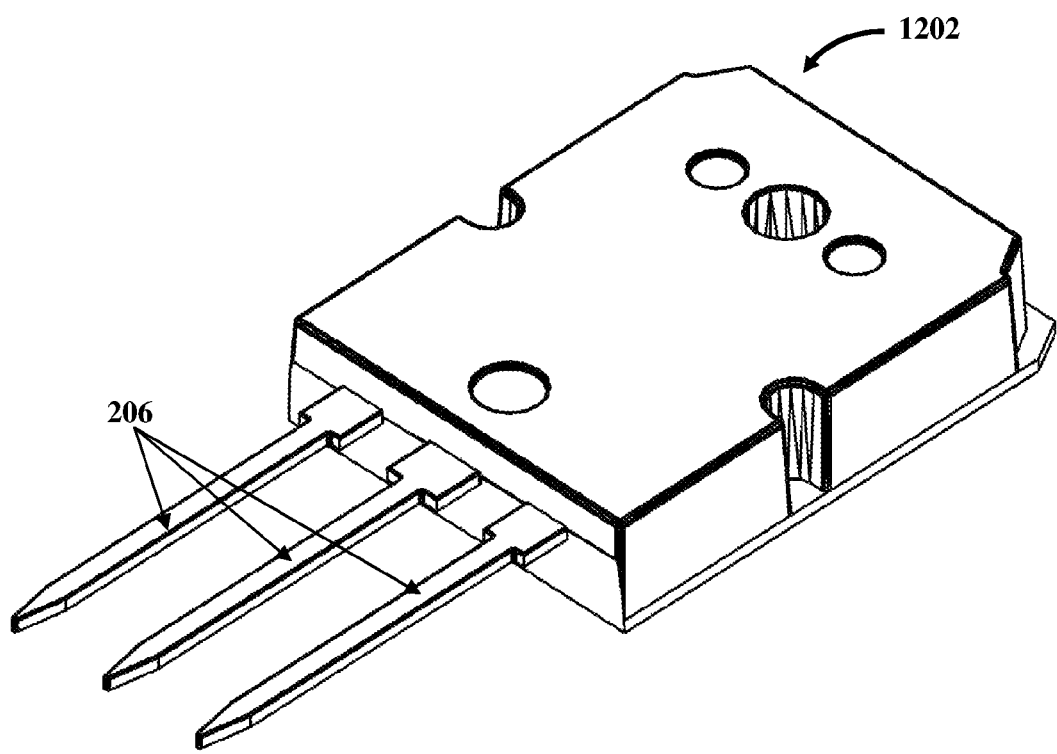

FIG. 12B exemplarily illustrate a top perspective view of a TO264 standard power semiconductor device package 1202. The lead frame 200 is etched to have a predetermined number of lead terminals 206, for example, three lead terminals 206. The distal ends 206b of the lead terminals 206 are exposed for external connection.

Figure 12C:
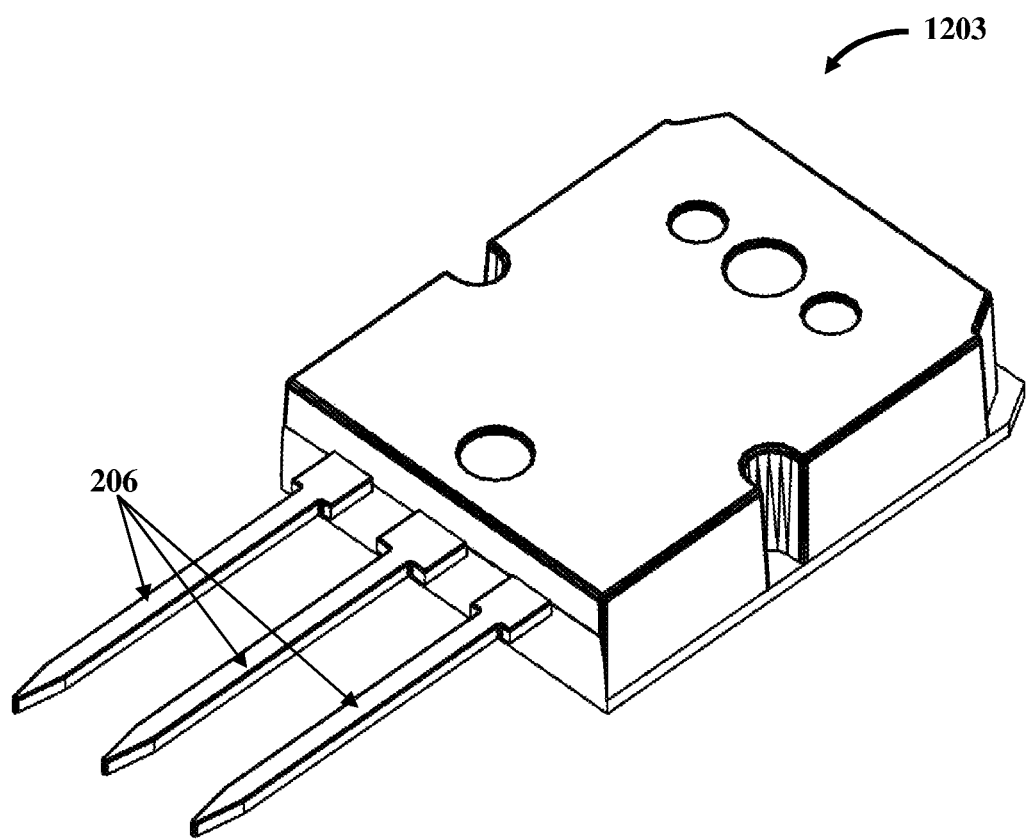

FIG. 12C exemplarily illustrate a top perspective view of a TO247 standard power semiconductor device package 1203. The lead frame 200 is etched to have a predetermined number of lead terminals 206, for example, three lead terminals 206. The distal ends 206b of the lead terminals 206 are exposed for external connection.

Figure 12D:
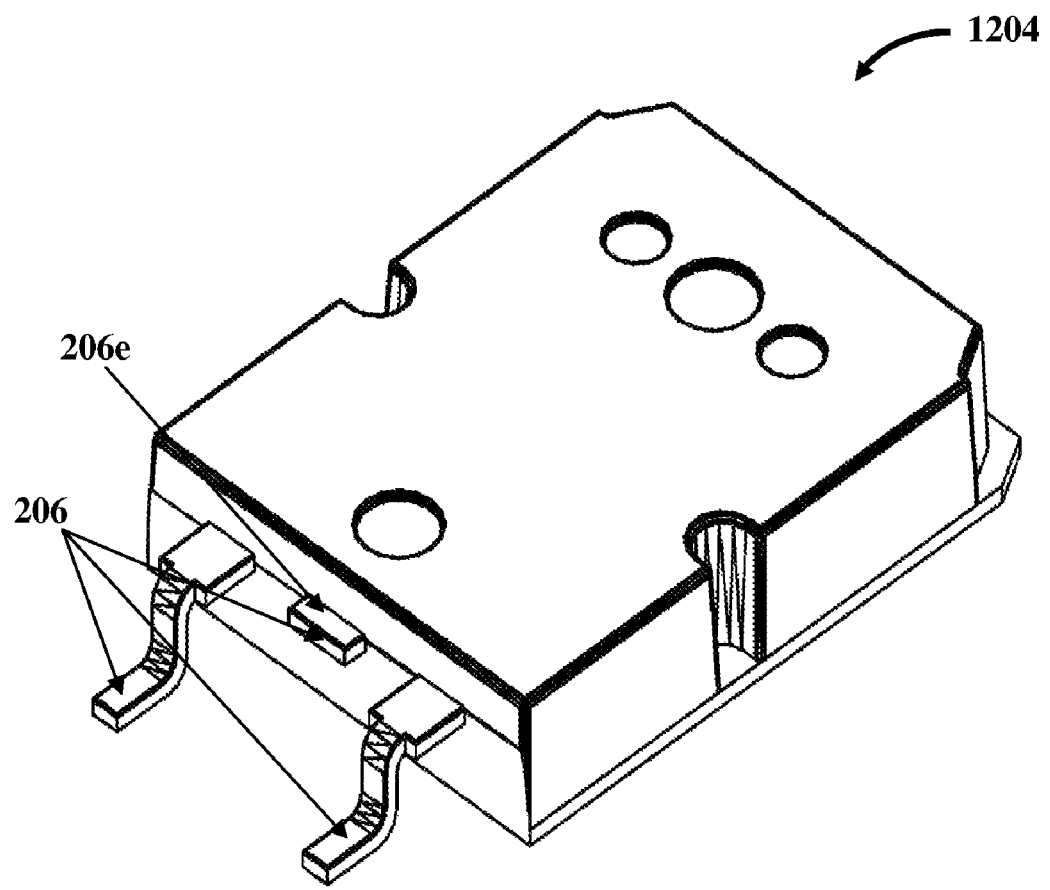

FIG. 12D exemplarily illustrates a top perspective view of a TO268 standard power semiconductor device package 1204. The lead frame 200 is etched to have a predetermined number of lead terminals 206 of a preconfigured shape. The lead terminal 206e connected to the base die paddle 207 is removed or cut at final trim. The removed or cut lead terminal 206e is exposed and creates a potential electrical short even if the lead terminal 206e is left unused in application. The method disclosed herein enables construction of the lead frame 200 with isolated lead terminals 206. Any of the lead terminals 206 can be isolated by removing the wire bonding, thereby increasing the safety of use.

Figure 13A:
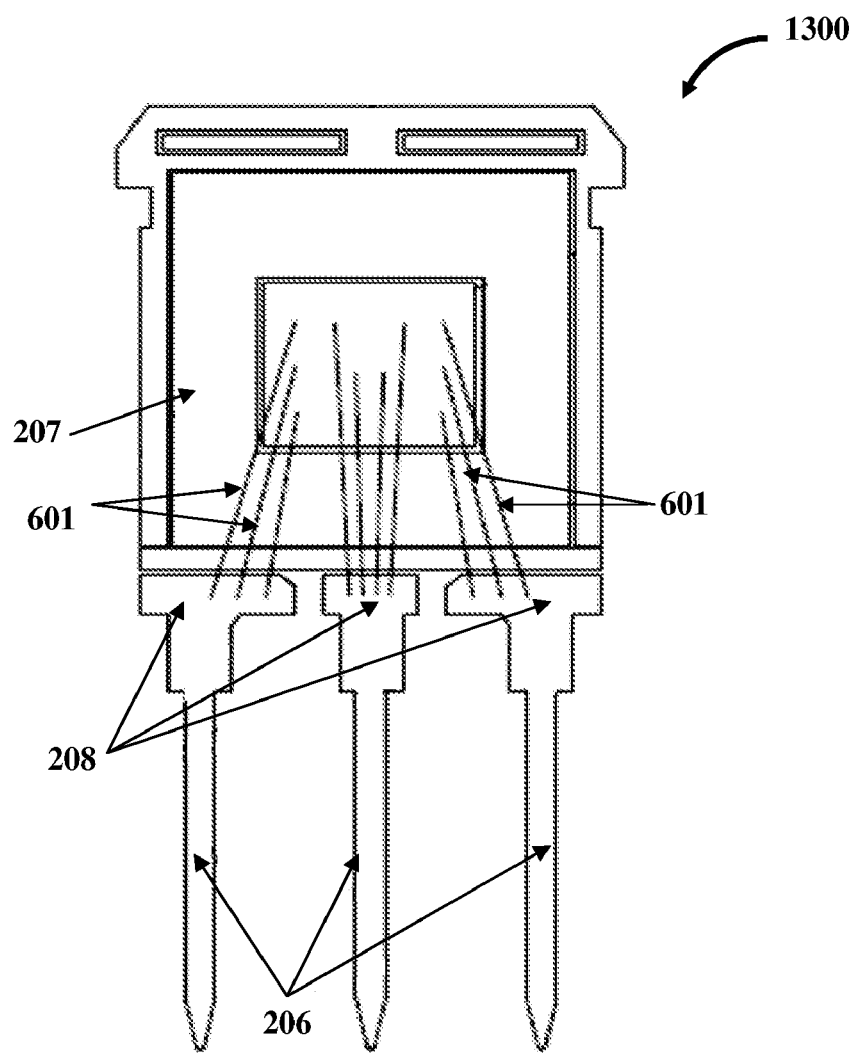
FIG. 13A exemplarily illustrates a lead frame selectively configured for constructing a power semiconductor device package for a half wave rectifier.
Figure 13B:
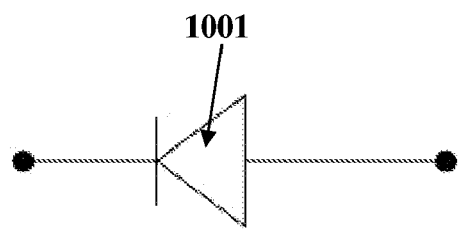
FIG. 13B exemplarily illustrates an electrical representation of the half wave rectifier.

FIG. 13A exemplarily illustrates a lead frame 200 selectively configured for constructing a power semiconductor device package 1300 for a half wave rectifier. The half wave rectifier is constructed by mounting a semiconductor power diode 1001 on a single base die paddle 207 and selectively configuring the base paddle tie bars 204 and the terminal tie bars 203 of the tie bar assembly 201. The lead terminals 206 are selectively connected to the base die paddle 207 and the semiconductor power diodes 1001 using wire bonds 601. An electrical representation of the half wave rectifier is exemplarily illustrated in FIG. 13B.

Figure 14A:
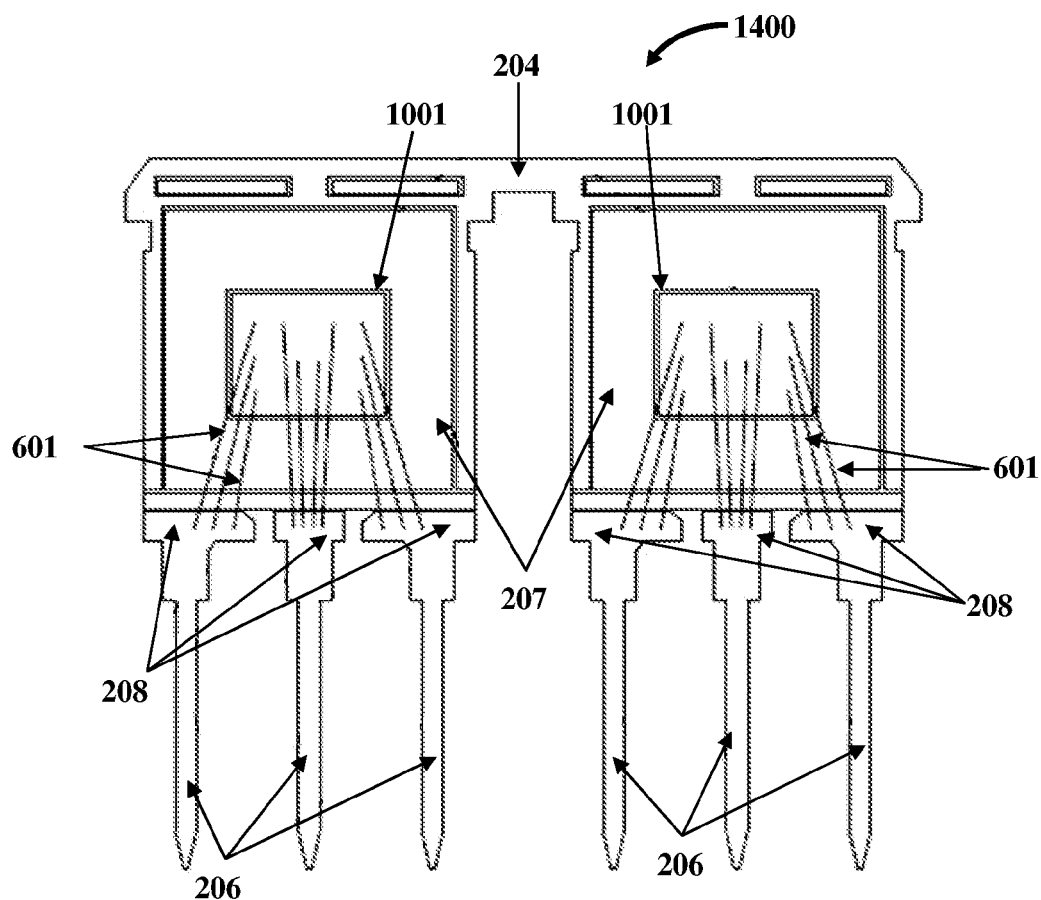
FIG. 14A exemplarily illustrates a lead frame selectively configured for constructing a power semiconductor device package for a full wave rectifier.

FIG. 14A exemplarily illustrates a lead frame 200 selectively configured for constructing a power semiconductor device package 1400 for a full wave rectifier. The full wave rectifier is constructed by mounting semiconductor power diodes 1001 on two separate base die paddles 207 and retaining the base paddle tie bars 204 between the two base die paddles 207. The base die paddles 207 in electrical communication with each other via the base paddle tie bars 204 form a common terminal for the semiconductor power diodes 1001 mounted on adjacent base die paddles 207 while the isolated lead terminals 206 can be wire bonded to the other side of the semiconductor power diodes 1001 using wire bonds 601 to form individual semiconductor power diode terminals.

In an example, the base paddle tie bars 204 between the two base die paddles 207 serves as a common drain for semiconductor power diodes 1001 mounted on the adjacent base die paddles 207. In another example, the semiconductor power diodes 1001 mounted on the adjacent base die paddles 207 can have a common cathode 1001b or a common anode 1001a.

Figure 14B:
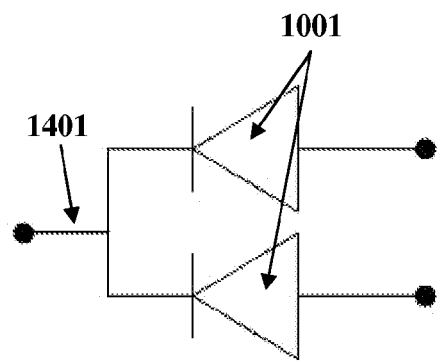
FIG. 14B exemplarily illustrates an electrical representation of the full wave rectifier.

FIG. 14B exemplarily illustrates an electrical representation of the full wave rectifier. By retaining the base paddle tie bars 204, the two separate base die paddles 207 are connected to achieve an electrical connection 1401 and to construct the non-isolated full wave rectifier 1400.

Figure 15A:
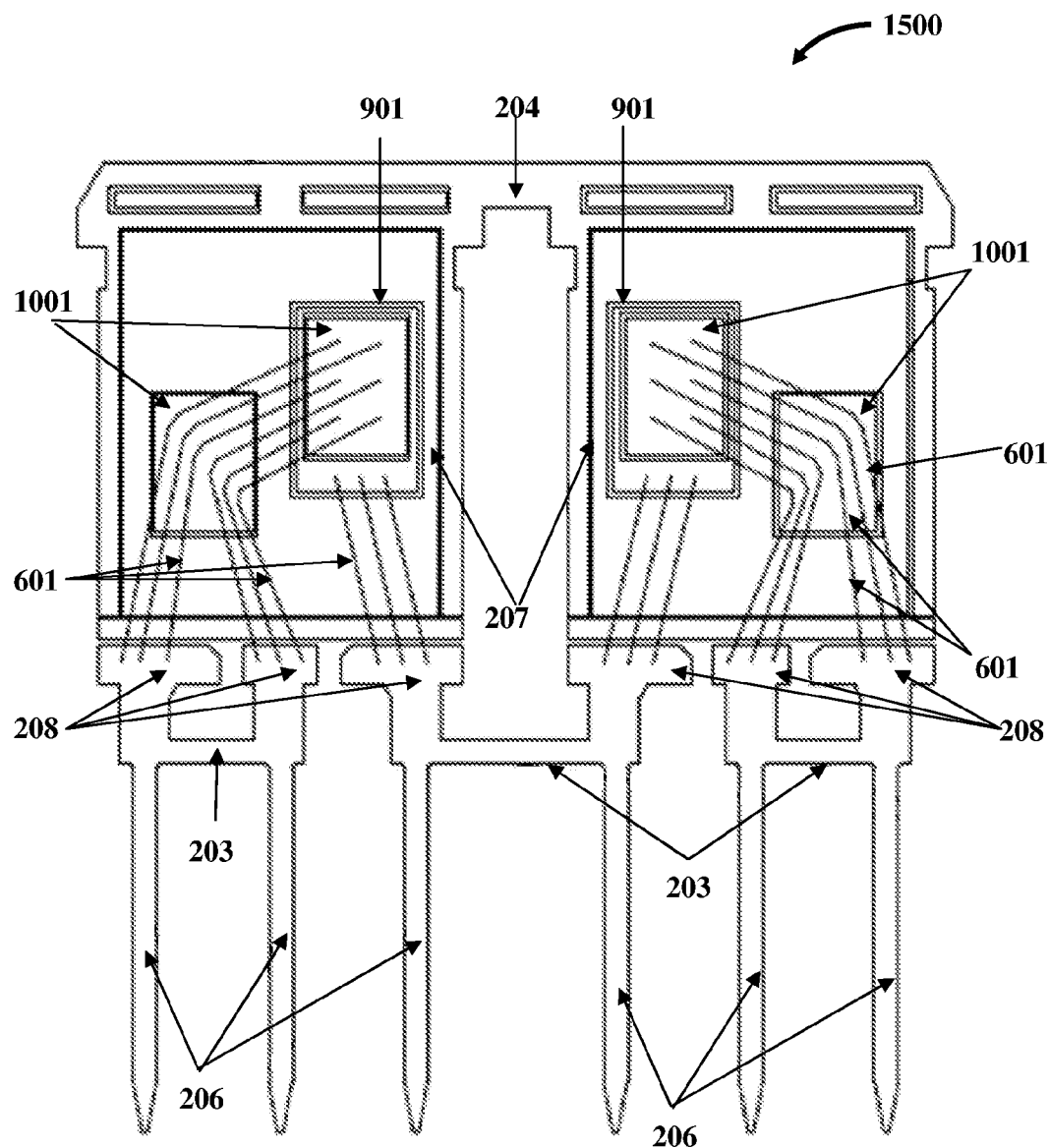
FIG. 15A exemplarily illustrates a lead frame selectively configured for constructing an isolated and a non-isolated power semiconductor device package for a bridge rectifier.

FIG. 15A exemplarily illustrates a lead frame 200 selectively configured for constructing an isolated and a non-isolated power semiconductor device package 1500 for a bridge rectifier. The bridge rectifier is constructed, for example, by mounting semiconductor power diodes 1001 on two separate base die paddles 207 directly or on the metallized substrate 901 mounted on the base die paddles 207, and selectively configuring the base paddle tie bars 204 and the terminal tie bars 203 of the tie bar assembly 201. For example, as illustrated in FIG. 15A, on each of the base die paddles 207, one of the semiconductor power diodes 1001 is directly mounted on the base die paddle 207 to construct a non-isolated semiconductor power diode 1000 as disclosed in the detailed description of FIGS. 10A-10B while the other one of the semiconductor power diodes 1001 is mounted on the metallized substrate 901 soldered or mounted on the base die paddle 207 to construct an isolated semiconductor power diode 1100 as disclosed in the detailed description of FIGS. 11A-11B.

The method disclosed herein enables construction of a power module 1500 by combining a packaged non-isolated power semiconductor device and a packaged isolated power semiconductor device. For example, the bridge rectifier is constructed by combining a non-isolated semiconductor power diode and an isolated power semiconductor power diode, where terminals are assigned to specific leads by wire bonding as well as the common base die paddle 207. The terminal bonding pads 208 of the lead terminals 206 are connected to the semiconductor power diodes 1001 through the wire bonds 601.

In an embodiment, the terminal tie bars 203 can be retained after the final configuration, for example, by trimming for doubling the current carrying capacity compared to standard TO247 and TO264 packages.

Figure 15B:
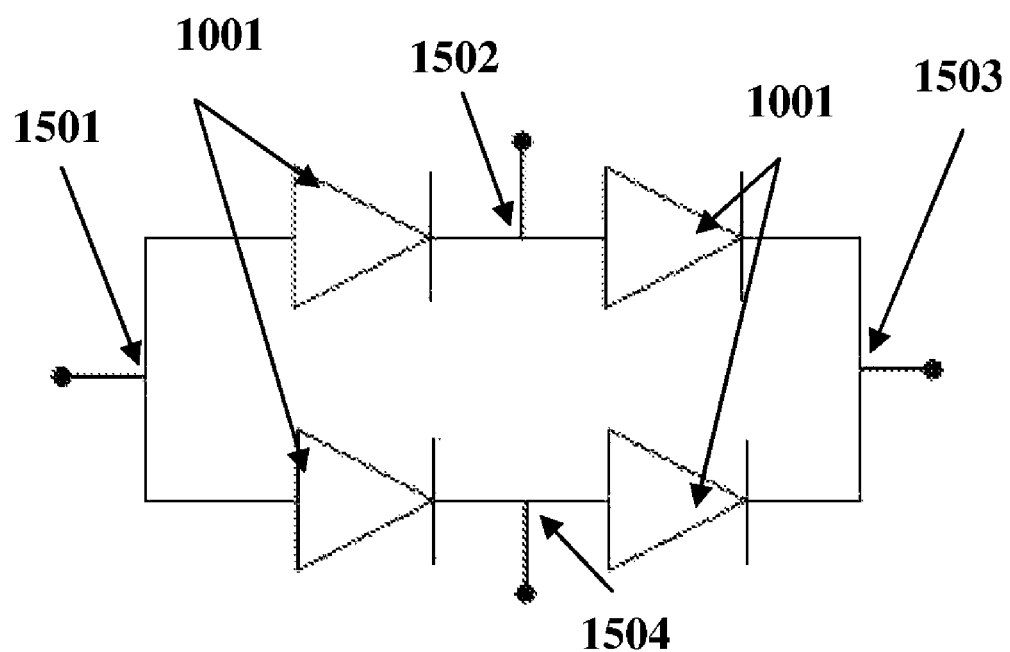
FIG. 15B exemplarily illustrates an electrical representation of the bridge rectifier.

FIG. 15B exemplarily illustrates an electrical representation of the bridge rectifier. The side tie bars 202, the terminal tie bars 203, and the base paddle tie bars 204 are selectively configured, and the lead terminals 206 are selectively connected to the semiconductor power diodes 1001 using wire bonds 601 to achieve electrical connections 1501, 1502, 1503, and 1504 between the semiconductor power diodes 1001 to construct the bridge rectifier.

Therefore, for power module applications, two or more adjacent base die paddles 207 may be packaged together by leaving the connecting base paddle tie bars 204 uncut. This would enable multiple power semiconductor devices, for example, semiconductor power diodes 1001 to be connected on the interconnected base die paddles 207 in multiple electrical configurations.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

I claim:

1. A method for packaging one or more power semiconductor devices, comprising:
   constructing a lead frame comprising one or more base die paddles, a plurality of lead terminals, and a tie bar assembly;
   connecting said one or more base die paddles of said lead frame to said lead terminals by said tie bar assembly, wherein said tie bar assembly mechanically couples said one or more base die paddles to each other and to said lead terminals;
   selectively configuring said tie bar assembly to isolate said lead terminals from said one or more base die paddles; and
   creating a plurality of selective connections between one or more of said lead terminals and said one or more power semiconductor devices mounted on said one or more base die paddles;
   whereby said selective configuration of said tie bar assembly and said selective connections created between said one or more of said lead terminals and said one or more power semiconductor devices enable flexible packaging of one or more isolated power semiconductor devices and one or more non-isolated power semiconductor devices and increases power handling capacity of said packaged one or more power semiconductor devices.

2. The method of claim 1, wherein said tie bar assembly comprises:

base paddle tie bars that connect said one or more base die paddles of said lead frame to each other;
side tie bars that extend at opposing ends of said lead frame and between adjacent said base die paddles of said lead frame, and connect said one or more base die paddles to said lead terminals; and
terminal tie bars that connect said lead terminals of said lead frame to each other.

3. The method of claim 1, further comprising selectively connecting one or more of said isolated lead terminals to said mounted one or more power semiconductor devices by wire bonding for enabling flexible connections of said isolated lead terminals to said mounted one or more power semiconductor devices.

4. The method of claim 1, wherein said packaging of said one or more isolated power semiconductor devices comprises:
mounting a metallized substrate on one or more of said one or more base die paddles of said lead frame; and
mounting said one or more power semiconductor devices on said mounted metallized substrate.

5. The method of claim 1, wherein said packaging of said one or more non-isolated power semiconductor devices comprises directly mounting said one or more power semiconductor devices on said one or more base die paddles of said lead frame.

6. The method of claim 1, wherein said tie bar assembly is selectively configured to utilize said isolated lead terminals as one of common lead terminals and individual lead terminals.

7. The method of claim 1, wherein said tie bar assembly is selectively configured to utilize two of said lead terminals as a common source and one of said lead terminals as a gate for increasing said power handling capacity of said one or more power semiconductor devices.

8. The method of claim 1, further comprising creating a power module by selectively configuring said tie bar assembly of said lead frame as a common terminal between adjacent said one or more power semiconductor devices.

9. The method of claim 1, wherein said tie bar assembly is selectively configured to flexibly utilize said lead terminals as a drain lead terminal, a gate lead terminal, and a source lead terminal.

10. The method of claim 1, further comprising connecting two of said lead terminals of said lead frame to a source, and one of said lead terminals of said lead frame to a gate, and leaving one of said base die paddles as a drain for increasing said power handling capacity of said mounted one or more power semiconductor devices, wherein said gate, said source, and said drain are three terminals of said mounted one or more power semiconductor devices.

11. The method of claim 1, further comprising configuring one or more of said isolated lead terminals as unused contacts for increasing safety of usage of said mounted one or more power semiconductor devices.

12. A lead frame for packaging one or more power semiconductor devices, comprising:
a plurality of lead terminals;
one or more base die paddles connected to said lead terminals by a tie bar assembly; and
said tie bar assembly selectively configured to isolate said lead terminals from said one or more base die paddles and to enable creation of a plurality of selective connections between one or more of said lead terminals and said one or more power semiconductor devices mounted on said one or more base die paddles, wherein said tie bar assembly mechanically couples said one or more base die paddles to each other and to said lead terminals;
whereby said selectively configured tie bar assembly enables flexible packaging of one or more isolated power semiconductor devices and one or more non-isolated power semiconductor devices and increases power handling capacity of said packaged one or more power semiconductor devices.

13. The lead frame of claim 12, wherein said lead terminals extend to a predetermined elevation from said one or more base die paddles.

14. The lead frame of claim 12, wherein said tie bar assembly comprises:
base paddle tie bars that connect said one or more base die paddles of said lead frame to each other;
side tie bars that extend at opposing ends of said lead frame and between adjacent said base die paddles of said lead frame, and connect said one or more base die paddles to said lead terminals; and
terminal tie bars that connect said lead terminals of said lead frame to each other.

15. The lead frame of claim 12, wherein said isolated lead terminals are utilized as one of common lead terminals and individual lead terminals.

16. The lead frame of claim 12, wherein two of said lead terminals are utilized as a common source and one of said lead terminals is utilized as a gate for increasing said power handling capacity of said one or more power semiconductor devices.

17. The lead frame of claim 12, wherein said lead terminals are flexibly utilized as a drain lead terminal, a gate lead terminal, and a source lead terminal for said mounted one or more power semiconductor devices.

18. The lead frame of claim 12, wherein one or more of said isolated lead terminals are selectively connected to said mounted one or more power semiconductor devices by wire bonding for enabling flexible connections of said isolated lead terminals to said mounted one or more power semiconductor devices.

19. The lead frame of claim 12, wherein two of said lead terminals are connected to a source, one of said lead terminals is connected to a gate, and one of said base die paddles is left as a drain for increasing said power handling capacity of said mounted one or more power semiconductor devices, wherein said gate, said source, and said drain are three terminals of said mounted one or more power semiconductor devices.

20. The lead frame of claim 12, wherein said tie bar assembly is selectively configured as a common terminal between adjacent said one or more power semiconductor devices for creating a power module.

21. A method for packaging one or more power semiconductor devices, comprising:
constructing a lead frame comprising one or more base die paddles, a plurality of lead terminals, and a tie bar assembly;
connecting said one or more base die paddles of said lead frame to said lead terminals by said tie bar assembly, wherein said tie bar assembly mechanically couples said one or more base die paddles to each other and to said lead terminals;
mounting said one or more power semiconductor devices on said one or more base die paddles;
selectively configuring said tie bar assembly to isolate said lead terminals from said one or more base die paddles and to enable creation of a plurality of selective connections between one or more of said lead terminals and said mounted one or more power semiconductor devices; and
selectively connecting one or more of said isolated lead terminals to said mounted one or more power semiconductor devices by wire bonding for enabling flexible connections of said isolated lead terminals to said mounted one or more power semiconductor devices.

22. The method of claim 21, further comprising encapsulating said mounted one or more power semiconductor devices in an encapsulating package body.

23. The method of claim 21, further comprising:
mounting a metallized substrate on one or more of said one or more base die paddles of said lead frame prior to said mounting of said one or more power semiconductor devices; and
mounting said one or more power semiconductor devices on said mounted metallized substrate to create an isolated power semiconductor device package.

24. A semiconductor package comprising:
a lead frame comprising one or more base die paddles, a plurality of lead terminals, and a tie bar assembly, wherein said tie bar assembly mechanically couples said one or more base die paddles to each other and to said lead terminals;
one or more power semiconductor devices mounted on one or more of said one or more base die paddles of said lead frame and/or a metallized substrate mounted on one or more of said one or more base die paddles;
said tie bar assembly selectively configured to isolate said lead terminals from said one or more base die paddles and to enable creation of a plurality of selective connections between one or more of said lead terminals and said mounted one or more power semiconductor devices; and
wire bonds that selectively connect one or more of said isolated lead terminals to said mounted one or more power semiconductor devices.

25. The semiconductor package of claim 24, further comprising an encapsulating package body that encapsulates said mounted one or more power semiconductor devices.

* * * * *